United States Patent
Lee et al.

(10) Patent No.: US 12,120,899 B2
(45) Date of Patent: Oct. 15, 2024

(54) LIGHT EMITTING DEVICE COMPRISING PEROVSKITE CHARGE TRANSPORT LAYER AND MANUFACTURING METHOD THEREOF

(71) Applicant: SEOUL NATIONAL UNIVERSITY R&DB FOUNDATION, Seoul (KR)

(72) Inventors: Tae-Woo Lee, Seoul (KR); Young-Hoon Kim, Seoul (KR); Himchan Cho, Seoul (KR)

(73) Assignee: SEOUL NATIONAL UNIVERSITY R&DB FOUNDATION (KR)

( * ) Notice: Subject to any disclaimer, the term of this patent is extended or adjusted under 35 U.S.C. 154(b) by 812 days.

(21) Appl. No.: 17/252,268

(22) PCT Filed: Jun. 14, 2019

(86) PCT No.: PCT/KR2019/007234
§ 371 (c)(1),
(2) Date: Dec. 14, 2020

(87) PCT Pub. No.: WO2019/240546
PCT Pub. Date: Dec. 19, 2019

(65) Prior Publication Data
US 2021/0305529 A1    Sep. 30, 2021

(30) Foreign Application Priority Data

Jun. 14, 2018  (KR) .......................... 10-2018-0068303

(51) Int. Cl.
*H10K 50/11* (2023.01)
*H10K 50/15* (2023.01)
(Continued)

(52) U.S. Cl.
CPC ............. *H10K 50/11* (2023.02); *H10K 50/15* (2023.02); *H10K 50/16* (2023.02); *H10K 50/17* (2023.02);
(Continued)

(58) Field of Classification Search
CPC ........ H10K 50/11; H10K 50/15; H10K 50/16; H10K 50/17; H10K 50/171; H10K 71/00;
(Continued)

(56) References Cited

U.S. PATENT DOCUMENTS

2019/0058135 A1* 2/2019 Ma ......................... H10K 50/11

FOREIGN PATENT DOCUMENTS

JP    2011091439 A    5/2011
KR    20170116630 A   10/2017
(Continued)

OTHER PUBLICATIONS

Samsung Display Co., Light-emitting Device, Dec. 2017, English translation by USPTO-PE2E (Year: 2017).*
(Continued)

*Primary Examiner* — Tu-Tu V Ho
(74) *Attorney, Agent, or Firm* — Renaissance IP Law Group LLP

(57) ABSTRACT

Disclosed are a light emitting device including a perovskite charge transport layer and a method of manufacturing the same. Perovskite thin film of the light emitting device is prepared by co-depositing or sequentially depositing perovskite precursors. Perovskite is directly deposited on the substrate, the thickness of the perovskite thin film is easily controlled, and the energy level is easily adjusted. So, a
(Continued)

charge transport layer functioning as a hole injection layer or an electron injection layer in the light emitting device may be manufactured to have suitable energy level.

10 Claims, 10 Drawing Sheets

(51) Int. Cl.
*H10K 50/16* (2023.01)
*H10K 50/17* (2023.01)
*H10K 71/00* (2023.01)
*H10K 85/30* (2023.01)
*H10K 71/16* (2023.01)
*H10K 101/30* (2023.01)
*H10K 101/40* (2023.01)
*H10K 102/00* (2023.01)

(52) U.S. Cl.
CPC ............ *H10K 50/171* (2023.02); *H10K 71/00* (2023.02); *H10K 85/30* (2023.02); *H10K 71/164* (2023.02); *H10K 2101/30* (2023.02); *H10K 2101/40* (2023.02); *H10K 2102/351* (2023.02)

(58) Field of Classification Search
CPC .. H10K 71/164; H10K 85/30; H10K 2101/30; H10K 2101/40; H10K 2102/351
USPC .......................................................... 257/40
See application file for complete search history.

(56) References Cited

FOREIGN PATENT DOCUMENTS

| KR | 20170137258 A | 12/2017 |
| KR | 20180009856 A | 1/2018 |
| KR | 20180057198 A | 5/2018 |

OTHER PUBLICATIONS

International Search Report for PCT/KR2019/007234 mailed Sep. 11, 2019.

* cited by examiner

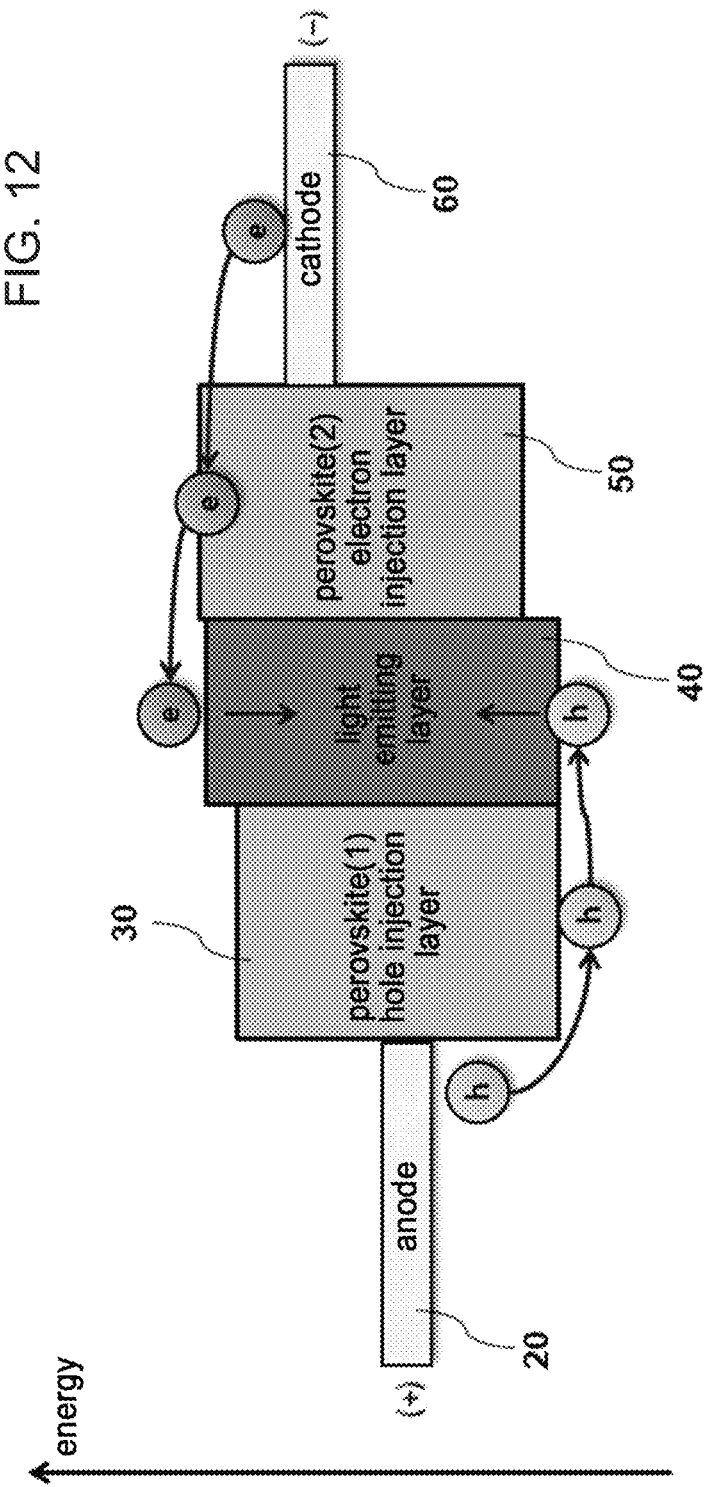

LIGHT EMITTING DEVICE COMPRISING PEROVSKITE CHARGE TRANSPORT LAYER AND MANUFACTURING METHOD THEREOF

TECHNICAL FIELD

The present invention relates to a light emitting device, and more particularly, to a light emitting device including a perovskite charge transport layer and a method of manufacturing the same.

BACKGROUND ART

The current megatrend in the display market is shifting from the existing high-efficiency and high-definition oriented displays to the emotional quality displays that aim to realize high-purity and natural colors. From this point of view, an organic light emitting diode (OLED) device based on an organic small-molecule light emitter has made great strides, and an inorganic quantum dot LED with improved color purity is being actively researched and developed as another alternative. However, both organic small molecule light emitters and inorganic quantum dot emitters have inherent limitations in terms of materials.

Existing organic small molecule light emitter has the advantage of high efficiency, but color purity is poor due to their wide emission spectrum. It has been known that the inorganic quantum dots have good color purity, but since their light-emission depends on the quantum size effect and it is difficult to control the size of the quantum dots to be uniform, there is a problem that the color purity decreases as the light emission goes toward higher energy. In addition, the two kinds of light emitters above have the disadvantage of being expensive. Therefore, there is a need for a new light emitter that overcomes the disadvantages of these organic light emitters and inorganic quantum dot light emitters while still maintaining their advantages.

Metal halide perovskites are in the spotlight academically and industrially because their material manufacturing cost is very low, device manufacturing and fabrication processes are simple, tuning of optical and electrical properties is possible through composition control, and their charge mobility is high. In particular, the metal halide perovskite has very excellent characteristics as a light emitter because it has high photoluminescence quantum efficiency, high color purity, and facile color control.

A conventional material having a perovskite structure ($ABX_3$) is an inorganic metal oxide.

These inorganic metal oxides are generally oxide material, and cations of metals such as Ti, Sr, Ca, Cs, Ba, Y, Gd, La, Fe, or Mn (alkali metals, alkaline earth metals, transition metals, and lanthanum groups) having different sizes are located at the A and B sites, oxygen anions are located at the X site, and the metal cations at the B site are bonded with the oxygen anions at the X site in the form of corner-sharing octahedron of 6-fold coordination. Examples thereof include $SrFeO_3$, $LaMnO_3$, and $CaFeO_3$.

In contrast, metal halide perovskite has an organic ammonium ($RNH_3$) cation, an organic phosphonium ($RPH_3$) cation, or an alkali metal cation at the A site in the $ABX_3$ structure, and halide anions ($Cl^-$, $Br^-$, or $I^-$) are positioned at the X site to form a perovskite structure. So, its composition is completely different from that of inorganic metal oxide perovskite.

In addition, the properties of the material are also different according to the difference of these material compositions. Inorganic metal oxide perovskite typically exhibits properties such as superconductivity, ferroelectricity, and colossal magnetoresistance, and thus, research has been generally applied to sensors, fuel cells, and memory devices. For example, yttrium barium copper oxide has superconducting or insulating properties depending on the oxygen contents.

On the other hand, metal halide perovskite is mainly used as a light emitter or photo-sensitive material because it has a high light absorption coefficient, high photoluminescence quantum efficiency, and high color purity (full width at half maximum less than 20 nm) which are determined by the crystal structure.

If organic-inorganic hybrid perovskite (i.e., an organometallic halide perovskite) among metal halide perovskites has a chromophore in the organic ammonium site (A) that has a smaller band gap than the central metal-halogen crystal structure ($BX_6$ octahedral lattice), the light emission comes from the organic ammonium, the full width at half maximum of the emission spectrum becomes wider than 100 nm, and thus light having high color purity cannot be emitted, so that it is not suitable as a light emitting layer. Therefore, it is not suitable for light emitter having high color purity. In order to make light emitter of high color purity, organic ammonium should not be a chromophore, and light emission needs to occur in the inorganic lattice composed of a central metal-halogen element. In other words, this application focuses on the development of a high color purity and high efficiency light emitter that emits light that originates from an inorganic lattice. For example, Korean Patent Publication No. 10-2001-0015084 (2001 Feb. 26) discloses an electroluminescent device using a dye-containing organic-inorganic hybrid material as a light emitting layer by forming their thin film instead of particles. This does not emit light from the perovskite lattice structure.

Until application date, light emitting devices of metal halide perovskite have been mainly manufactured through a solution process. The solution process does not require expensive deposition equipment and has the advantage that it is easy to manufacture large area devices, but the uniformity of the formed thin film is poor and thickness control is difficult, and the materials that can be mixed are limited by the characteristics of the solvent.

In the metal halide perovskite light emitting device, the handicap is a non-uniform thin film. In a thin film device composed of a stacked thin film, the non-uniformity of the thin film is one of the factors that greatly deteriorate the device performance by breaking the charge balance and causing a leakage current. In particular, since the morphology of the thin film of the metal halide perovskite varies greatly depending on the conditions for forming the thin film and the surrounding environment, the controlled uniformity of the thin film is very important in the performance of the perovskite light emitting device. For example, a non-uniform perovskite thin film can be made of $CH_3NH_3PbBr_3$ using a general spin coating process. When an additional nanocrystal pinning process is not used, there is a problem that a thin film is formed with a morphology of isolated crystals due to spontaneous crystallization [Science 2015, 350, 1222].

The aforementioned nanocrystal pinning process is a process designed to improve the uniformity of the metal halide perovskite thin film and reduce the size of the crystal [Science 2015, 350, 1222]. The nanocrystal pinning process greatly improves the uniformity of the thin film by dripping the solvent during the spin coating process. In addition, the nanocrystal pinning process has the advantage that it enables control of the size and packing density of the perovskite crystals because crystallization that proceeds gradually during the spin coating process is forcibly controlled by the dripped solvent.

However, in the case of using the nanocrystal pinning process, the quality of the thin film can be greatly influenced by the processing environment, so even if the same process is used, there is a disadvantage that the film quality has a large deviation. In addition, since the film quality of the thin film is improved only in a region where nanocrystal pinning process is applied, there may be limitations in manufacturing a large-area device.

In addition, a thin film formed through the solution process has a problem that it is impossible to finely control the thickness.

On the other hand, metal halide perovskite has an energy level similar to that of an organic semiconductor material used in a light emitting device, and has a much higher charge carrier mobility than an organic semiconductor, so it is very promising not only as a light emitting layer but also a charge transport layer. A study on manufacturing a light emitting device by forming a metal halide perovskite as a hole transport layer using a solution process has been published [Organic Electronics 2017, 50, 411]. However, when the device uses a solution process, it is impossible to finely control the thickness of the hole transport layer, and thus there is a problem that it cannot be adjusted to an optimized energy level that leads to high electroluminescence efficiency.

Accordingly, the inventors of the present invention manufacture a perovskite light emitting device having high electroluminescence efficiency by controlling the energy level of a perovskite thin film. The inventors found that the perovskite thin film can be prepared to have an energy level suitable for a charge transport layer that is a hole injection layer or an electron injection layer by uniformly and finely controlling the thickness through the evaporation process. The inventors of the present invention have completed the present invention by manufacturing a light emitting device including a perovskite charge transport layer in which the energy level is adjusted.

DISCLOSURE

Technical Problem

The present invention is directed to provide a light emitting device including a perovskite charge transport layer of which energy level is adjusted through a evaporation process.

In addition, the present invention is directed to provide a method of manufacturing a light emitting device including the perovskite charge transport layer.

Technical Solution

One aspect of the present invention provides a light emitting device having an anode and a cathode, a light emitting layer disposed between the anode and the cathode, a first charge transport layer disposed between the anode and the light emitting layer, and functioning as a hole injection layer or a hole transport layer, and
a second charge transport layer disposed between the light emitting layer and the cathode, and functioning as an electron injection layer or an electron transport layer, wherein the first charge transport layer or the second charge transport layer adjacent to the light emitting layer is a perovskite thin film.

Preferably, the perovskite thin film of the first charge transport layer and the perovskite thin film of the second charge transport layer may be the same or different from each other Preferably, a perovskite of the perovskite thin film may have structure of $ABX_3$, $A_2BX_4$, $ABX_4$ or $A_{n-1}Pb_nI_{3n+1}$ (n is an integer between 2 and 6), wherein the A may be an organic ammonium ion, an organic amidinium ions, organic phosphonium ions, alkali metal ions or derivatives, the B may be a transition metal, rare earth metal, alkaline earth metal, organic material, inorganic material, ammonium, its derivatives, or a combination thereof, and the X may be a halogen ion or a combination of different halogen ions.

Preferably, the A may be $CH(NH_2)_2$, $C_xH_{2x+1}(CNH_3)$, $(CH_3NH_3)_n$, $((C_xH_{2x+1})_nNH_3)_n(CH_3NH_3)_n$, $R(NH_2)_2$ (R=alkyl), $(C_nH_{2n+1}NH_3)_n$, $CF_3NH_3$, $(CF_3NH_3)_n$, $((C_xF_{2x+1})_nNH_3)_n(CF_3NH_3)_n$, $((C_xF_{2x+1})_nNH_3)_n$, $(C_nF_{2n+1}NH_3)_n$ (n and x are integers from 1 to 100), Na, K, Rb, Cs, Fr, a combination or derivative thereof, the B is Pb, Mn, Cu, Ga, Ge, In, Al, Sb, Bi, Po, Sn, Eu, Yb, Ni, Co, Fe, Cr, Pd, Cd, Ca, Sr, organic ammonium, inorganic ammonium, an organic cation, a combination or derivative thereof, and the X is Cl, Br, I, or a combination thereof.

Preferably, size of the crystal in the perovskite thin film may be 1 nm to 5 μm.

Preferably, thickness of the perovskite thin film may be 10 nm to 5 μm.

Preferably, the perovskite thin film may be formed by direct crystallization using co-depositing or sequentially depositing a AX compound and a $BX_2$ compound which are perovskite precursors and individually loaded in different crucibles.

Preferably, in the case that the perovskite thin film is used as the first charge transport layer, the energy level of VBM of the perovskite thin film may be lower than the energy level of HOMO of the light emitting layer.

Preferably, in the case that the perovskite thin film is used as the second charge transport layer, the energy level of CBM of the perovskite thin film may be higher than the energy level of LUMO of the light emitting layer.

Another aspect of the present invention provides a method of manufacturing light emitting device has forming the anode on substrate, forming the first charge transport layer as the hole injection layer or the hole transport layer on the anode, forming the light emitting layer on the first charge transport layer, forming the second charge transport layer as the electron injection layer or the electron transport layer on the light emitting layer, and forming the cathode on the second charge transport layer, wherein the forming the first charge transport layer or the forming the second charge transport layer is a step of forming the perovskite thin film by using a evaporation method.

The other aspect of the present invention provides a method of manufacturing light emitting device has forming the cathode on substrate, forming the second charge transport layer as the electron injection layer or the electron transport layer on the cathode, forming the light emitting layer on the second charge transport layer, forming the first charge transport layer as the hole injection layer or the hole transport layer on the light emitting layer, and forming the anode on the first charge transport layer, wherein the forming the first charge transport layer or the forming the second charge transport layer is a step of forming the perovskite thin film by using a evaporation method.

Preferably, the evaporation method may be selected from group consisting of vacuum deposition, thermal deposition, flash deposition, laser deposition, chemical vapor deposition, atomic layer deposition, physical vapor deposition, physical-chemical co-evaporation deposition, sequential vapor deposition and solution process-assisted thermal deposition.

Advantageous Effects

According to the present invention, the perovskite thin film of the light emitting device may have uniformity, since the synthesis of perovskite is directly formed on the substrate by co-depositing or sequentially depositing perovskite precursors. In addition, it is easy to control the thickness of the thin film, and it can be manufactured to have an energy level suitable for the charge transport layer that is used as a hole injection layer or an electron injection layer in the light emitting device.

DESCRIPTION OF DRAWINGS

FIG. 12 is the other diagram showing an energy level of a light emitting device (normal structure) including a first perovskite hole injection layer and a second perovskite electron injection layer according to an embodiment of the present invention.

MODES OF THE INVENTION

Figure 1:
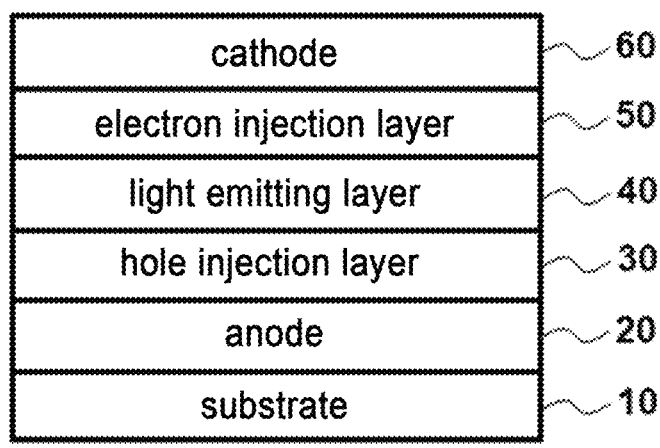
FIG. 1 is a cross-sectional view of a light emitting device (normal structure) according to an embodiment of the present invention.

Hereinafter, embodiments of the present invention will be described in detail with reference to the accompanying drawings.

While the present invention is susceptible to various modifications and alternative forms, specific embodiments thereof are shown by way of example in the drawings and will herein be described in detail. However, it should be understood that there is no intent to limit the invention to the particular forms disclosed but rather the invention is to cover all modifications, equivalents, and alternatives falling within the spirit and scope of the invention defined by the appended claims.

When an element such as a layer, a region, and a substrate is referred to as being disposed "on" another element, it should be understood that the element may be directly formed on the other element or an intervening element may be interposed therebetween.

It should be understood that, although the terms "first," "second," etc. may be used herein to describe various elements, components, areas, layers, and/or regions, these elements, components, areas, layers, and/or regions are not limited by these terms.

In the present invention, the "light emitting device" may include all devices that emit light, such as a light emitting diode, a light emitting transistor, a laser, and a polarized light emitting device.

In the present invention, the "charge transport layer" refers to a hole injection layer, a hole transport layer, an electron transport layer, or an electron injection layer adjacent to the emission layer, which moves holes or electrons from the anode or the cathode to the emission layer. In general, the charge transport layer refers to a hole injection layer or an electron injection layer adjacent to the emission layer, but if a hole transport layer is disposed between the emission layer and the hole injection layer, and an electron transport layer is disposed between the emission layer and the electron injection layer, a hole transport layer or an electron transport layer adjacent to the light emitting layer is also included in the charge transport layer.

FIG. 1 is a schematic diagram showing a light emitting device according to an embodiment of the present invention.

Referring to FIG. 1, the light emitting device according to the present invention may include an anode 20 and a cathode 60, and a light emitting layer 40 disposed between the two electrodes, and may be provided with a hole injection layer 30 to facilitate the injection of holes. In addition, an electron injection layer 50 for facilitating injection of electrons may be provided between the light emitting layer 40 and the cathode 60.

In addition, the light emitting device according to the present invention may further include a hole transport layer (not shown) for transporting holes between the hole injection layer 30 and the light emitting layer 40.

In addition, the light emitting device according to the present invention may further include an electron transport layer (not shown) for transporting electrons between the electron injection layer 50 and the light emitting layer 40.

In addition, a hole blocking layer (not shown) may be disposed between the light emitting layer 40 and the electron transport layer. In addition, an electron blocking layer (not shown) may be disposed between the light emitting layer 40 and the hole transport layer. However, the present invention is not limited thereto, and the electron transport layer may serve as a hole blocking layer, or the hole transport layer may serve as an electron blocking layer.

The substrate 10 serves as a support for the light emitting device and may be a transparent material. In addition, the substrate 10 may be a flexible material or a hard material, and preferably may be a flexible material.

The material of the substrate 10 is glass, sapphire, quartz, silicon, polyethylene terephthalate (PET), polystyrene (PS), polyimide (PI), polyvinyl chloride (PVC), polyvinylpyrrolidone (PVP), polyethylene (PE), or the like, but is not limited thereto.

Figure 2:
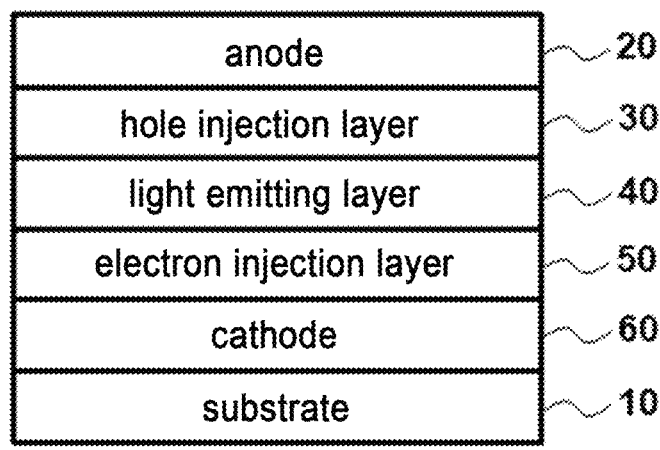
FIG. 2 is a cross-sectional view of a light emitting device (inverted structure) according to an embodiment of the present invention.

The substrate 10 may be disposed under the anode 20 or may be disposed under the cathode 60. In other words, the anode 20 may be formed before the cathode 60 on the substrate, or the cathode 60 may be formed before the anode 20. Accordingly, the light emitting device may have both the normal structure of FIG. 1 and the inverted structure of FIG. 2.

The anode 20 may be a conductive metal oxide, a metal, a metal alloy, or a carbon material. Conductive metal oxides may include indium tin oxide (ITO), fluorine tin oxide (FTO), antimony tin oxide (ATO), fluorine-doped tin oxide (FTO), $SnO_2$, ZnO, or a combination of these. Metals or metal alloys suitable as the anode 20 may be Au or CuI. The carbon material may be graphite, graphene, or carbon nanotubes.

The cathode 60 is a conductive film having a lower work function than the anode 20, for example, may be formed using a metal such as aluminum, magnesium, calcium, sodium, potassium, indium, yttrium, lithium, silver, lead or cesium, or using a combination of two or more of these.

The anode 20 and the cathode 60 may be formed using a sputtering method, a vapor deposition method, or an ion beam deposition method.

The light emitting layer 40 is formed between the hole injection layer 30 and the electron injection layer 50, and the holes introduced from the anode 20 and the electrons introduced from the cathode 70 are combined, so that excitons are formed. And then light corresponding to band-gap energy is emitted while the excitons decay to a ground state.

The light emitting layer 40 may include a blue, red, or green emission material, and may include a host and a dopant. The material forming the light emitting layer 40 is not particularly limited. More specifically, the light emitting layer 40 includes oxadiazole dimer dyes (Bis-DAPOXP), spiro compounds (Spiro-DPVBi, Spiro-6P), triarylamine compounds, bis (styryl) amine (DPVBi, DSA), 4,4'-bis(9-ethyl-3-carbazovinylene)-1,1'-biphenyl (BCzVBi), perylene, 2,5,8,11-tetra-tert-butylperylene (TPBe), 9H-carbazole-3,3'-(1,4-phenylene-di-2,1-ethene-diyl)bis[9-Ethyl-(9C)] (BCzVB), 4,4-bis[4-(di-p-tolylamino)styryl]biphenyl (DPAVBi), 4-(di-p-tolylamino)-4'-[(di-p-tolylamino)styryl] stilbene (DPAVB), 4,4'-bis[4-(diphenylamino)styryl]biphenyl (BDAVBi), bis(3,5-difluoro-2-(2-pyridyl)phenyl-(2-carboxypyridyl)iridium III (FIrPic), etc. (the above are blue light emitting materials), and 3-(2-benzothiazolyl)-7-(diethylamino)coumarin (Coumarin 6), 2,3,6,7-tetrahydro-1,1,7,7,-tetramethyl-1H,5H,11H-10-(2-benzothiazolyl)quinozino-[9,9a,1gh] Coumarin (C545T), N,N'-dimethyl-quinacridone (DMQA), tris(2-phenylpyridine) iridium (III) ($Ir(ppy)_3$), etc. (the above are green light emitting materials), tetraphenylnaphtacene (rubrene), tris(1-phenylisoquinoline) iridium(III) ($Ir(piq)_3$), bis(2-(2'-benzothienyl)-pyridinato-N,C3') iridium(acetylacetonate) ($Ir(btp)_2(acac)$), tris (dibenzoylmethane)phenanthroline europium(III) ($Eu(dbm)_3(phen)$), tris[4,4'-di-tert-butyl-(2,2')-bipyridine] ruthenium(III) complex ($Ru(dtb-bpy)3·2(PF6)$), DCM1, DCM2, Eu (tenoyl acetone trifluoride: thenoyltrifluoroacetone)$_3$($Eu(TTA)_3$, or butyl-6-(1,1,7,7-tetramethyl juloridyl-9-enyl)-4H-pyran) (butyl-6-(1,1,7,7-tetramethyl-julolidyl-9-enyl)-4H-pyran: DCJTB), etc (the above are red light emitting materials). In addition, polymer light emitting material includes phenylene-based, phenylene vinylene-based, thiophene-based, fluorene-based, or spiro-fluorene-based polymers. It may also include an aromatic compound including nitrogen, but is not limited thereto.

The light emitting layer 40 may be manufactured by adding a light emitting dopant to light emitting host. Material for the fluorescent host includes tris(8-hydroxy-quinolinato)aluminum ($Alq_3$), 9,10-di(naphth-2-yl)anthracene (AND), 3-tert-butyl-9,10-di(naphth-2-yl)anthracene (TBADN), 4,4'-bis(2,2-diphenylvinyl)-1,1'-biphenyl (DPVBi), 4,4'-bis(2,2-diphenyl-ethen-1-yl)-4,4'-methylphenyl (p-DMDPVBi), tert(9,9-diarylfluorene) (TDAF), 2-(9,9'-spirobifluoren-2-yl)-9,9'-spirobifluorene (BSDF), 2,7-bis (9,9'-spirobifluoren-2-yl)-9,9'-spirobifluorene (TSDF), bis (9,9-diarylfluorene)s (BDAF), or 4,4'-bis(2,2-diphenyl-ethen-1-yl)-4,4'-di-(tert-butyl)phenyl (p-TDPVBi), etc. And the material of the phosphorescent host may be 1,3-bis (carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazole-9)-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bisbis(9-phenyl-9H-carbazole)fluorene (FL-4CBP), 4,4'-bis(carbazol-9-yl)-9,9-di-tolyl-fluorene (DPFL-CBP), 9,9-bis(9-phenyl-9H-carbazole) Fluorene (FL-2CBP) or the like.

The content of the dopant is varied depending on the material forming the light emitting layer, but is generally 3 to 10 wt % based on 100 wt % of the material (total weight of the host and dopant) forming light emitting layer.

The light emitting layer 40 can be formed by performing an arbitrarily selected method among various known methods, such as a spin coating method, a spray method, a dip coating method, a bar coating method, a nozzle printing method, a slot-die coating method, a gravure printing method, a cast method, or a Langmuir-Blodgett film method (LB method). When the light emitting layer 40 is formed, conditions for forming a thin film and coating conditions may vary depending on the target compound, the structure and thermal properties of the target layer, and the like.

The hole injection layer 30 and/or the hole transport layer has HOMO (Highest Occupied Molecular Orbital) level between the work function of the anode 20 and the HOMO level of the light emitting layer 40, and functions to increase the efficiency of injection or transport of holes from the anode 20 to the light emitting layer 40.

The hole injection layer 30 or the hole transport layer may include a material commonly used as a hole transport material, and one layer may include different hole transport material layers. Hole transport materials include, for example, mCP (N,Ndicarbazolyl-3,5-benzene), PEDOT: PSS (poly(3,4-ethylenedioxythiophene):polystyrenesulfonate), NPD (N,N'-di(1-naphthyl)-N,N'-diphenylbenzidine), TPD (N,N'-Bis(3-methylphenyl)-N,N'-diphenylbenzidine), DNTPD (N4,N4'-Bis[4-[bis(3-methylphenyl)amino]phenyl]-N4,N4'-diphenyl-[1,1'-biphenyl]-4,4'-diamine), N,N'-diphenyl-N,N'-dinaphthyl-4, 4'-diaminobiphenyl; N,N,N'N'-tetra-p-tolyl-4,4'-diaminobiphenyl, N,N,N'N'-tetraphenyl-4,4'-diaminobiphenyl, porphyrin compound derivatives such as copper(II)1,10,15,20-tetraphenyl-21H,23H-porphyrin, TAPC (1,1-Bis[4-[N,N'-Di(p-tolyl)Amino]Phenyl]Cyclohexane), triarylamine derivatives such as N,N,N-tri(p-tolyl)

amine, or 4,4',4'-tris[N-(3-methylphenyl)-N-phenylamino] triphenylamine, carbazole derivatives such as N-phenylcarbazole or polyvinylcarbazole, phthalocyanine derivatives such as metal-free phthalocyanine or copper phthalocyanine, starburst amine derivatives, enaminestilbene derivatives, derivatives of aromatic tertiary amines and styryl amine compounds, or polysilane. Such a hole transport material may serve as an electron blocking layer.

The hole injection layer 30 may also include a hole injection material. For example, the hole injection layer may include at least one of a metal oxide and a hole injection organic material.

When the hole injection layer 30 includes a metal oxide, the metal oxide may include $MoO_3$, $WO_3$, $V_2O_5$, nickel oxide (NiO), copper oxide (Copper(II) Oxide: CuO), copper aluminum oxide (Copper Aluminum Oxide: CAO, $CuAlO_2$), Zinc Rhodium Oxide (ZRO, $ZnRh_2O_4$), GaSnO, and GaSnO doped with metal-sulfide (FeS, ZnS or CuS).

When the hole injection layer 30 includes a hole injection organic material, the hole injection layer 30 may be formed by such various known method that is a vacuum deposition method, a spin coating method, a cast method, a Langmuir-Blodgett (LB) method, a spray coating method, a dip coating method, a gravure coating method, a reverse offset coating method, a screen printing method, a slot-die coating method, or a nozzle printing method.

The hole injectable organic material is fullerene (C60), HAT-CN (1,4,5,8,9,11-hexaazatriphenylenehexacarbonitrile), F16CuPC, CuPC, m-MTDATA [4,4',4"-tris (3-methylphenylphenylamino) triphenylamine] (see formula below), NPB [N,N'-Di(1-naphthyl)-N,N'-diphenyl-(1,1'-biphenyl)-4,4'-diamine], TDATA (see formula below), 2T-NATA (see formula below), Pani/DBSA (Polyaniline/ Dodecylbenzenesulfonic acid: polyaniline/dodecylbenzenesulfonic acid), PEDOT/PSS (Poly(3,4-ethylenedioxythiophene)/Poly(4-styrenesulfonate): Poly(3,4-ethylenedioxythiophene)/poly (4-styrenesulfonate)), Pani/ CSA (Polyaniline/Camphor sulfonic acid: polyaniline/ camphor sulfonic acid) or PANI/PSS (Polyaniline/Poly(4-styrenesulfonate): polyaniline)/poly(4-styrenesulfonate)).

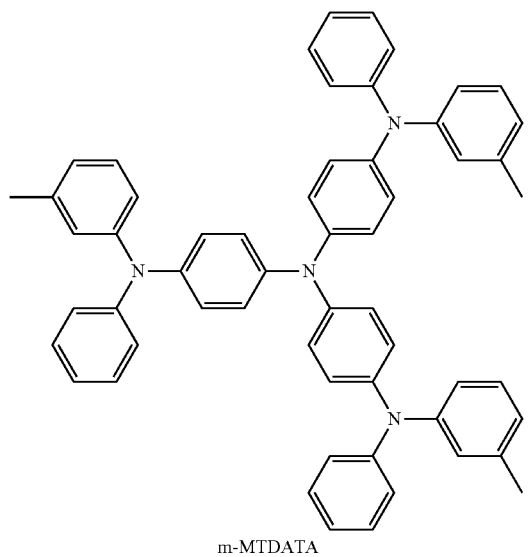

m-MTDATA

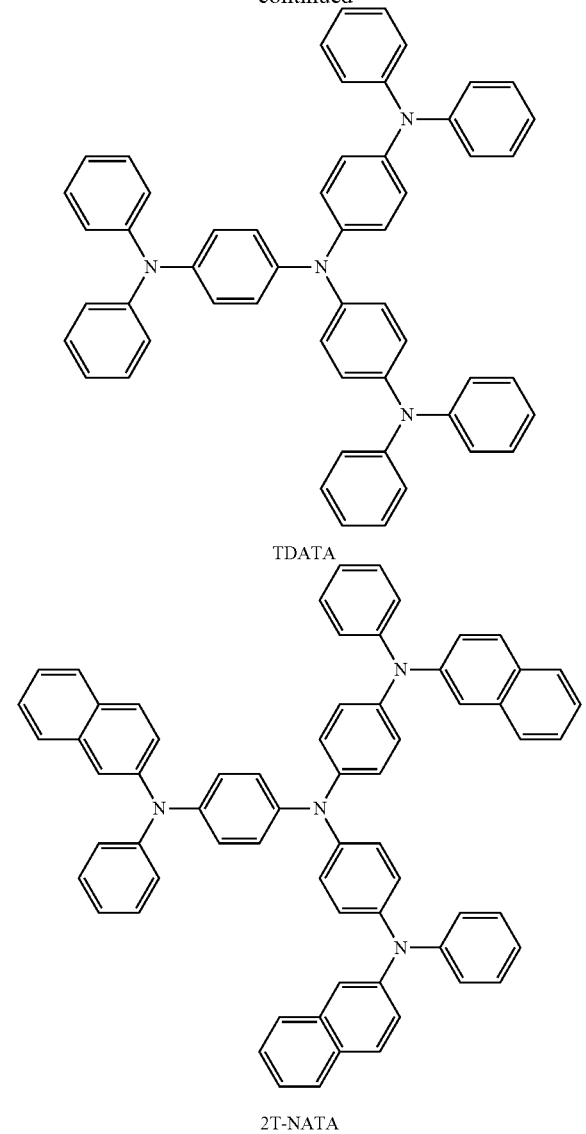

TDATA

2T-NATA

For example, the hole injection layer may be a layer consisting of a hole injection organic material matrix doped with the metal oxide. In this case, the doping concentration is preferably 0.1 wt % to 80 wt % based on the total weight of the hole injection layer.

The thickness of the hole injection layer may be 10 Å to 10,000 Å, for example, 100 Å to 1,000 Å. When the thickness of the hole injection layer satisfies the above-described range, the driving voltage is not increased, so that a high quality organic device can be implemented.

In addition, a hole transport layer may be further formed between the light emitting layer and the hole injection layer.

The hole transport layer may include a known hole transport material. For example, the hole transport material that may be included in the hole transport layer is 1,3-bis (carbazol-9-yl)benzene (MCP), 1,3,5-tris(carbazol-9-yl) benzene (TCP), 4,4',4"-tris(carbazol-9-yl)triphenylamine (TCTA), 4,4'-bis(carbazol-9-yl)biphenyl (CBP), N,N'-bis (naphthalen-1-yl)-N,N'-bis(phenyl)benzidine (NPB), N,N'-bis(naphthalen-2-yl)-N,N'-bis(phenyl)-benzidine (β-NPB), N,N'-bis(naphthalen-1-yl)-N,N'-bis(phenyl)-2,2'-dimethylbenzidine (α-NPD), di-[4-(N,N-ditolyl-amino)-phenyl]cyclohexane (TAPC), N,N,N',N'-tetra-naphthalen-2-yl-benzidine (β-TNB) and N4,N4,N4',N4'-tetra(biphenyl-4-yl)biphenyl-4,4'-diamine (TPD15), poly(9,9-dioctylfluorene-co-bis-N,N'-(4-butylphenyl)-bis-N,N'-phenyl-1,4-phenylenediamine (PFB), poly(9,9'-dioctylfluorene-co-N-(4-butylphenyl)diphenylamine) (TFB), poly(9,9'-dioctylfluorene-co-bis-N,N'-(4-butylphenyl)-bis-N,N'-phenylbenzidine) (BFB), or poly(9,9-dioctylfluorene-co-bis-N,N'-(4-methoxyphenyl)-bis-N,N'-phenyl-1,4-phenylenediamine) (PFMO).

The chemical formula of the hole transport material is summarized in Table 1 below.

TABLE 1

| name | chemical formula |
|---|---|
| NPB | |
| MCP | |
| TCP | |

TABLE 1-continued

| name | chemical formula |
|---|---|
| TCTA | |
| CBP | |
| β-NPB | |
| α-NPD | |

TABLE 1-continued

| name | chemical formula |
|---|---|
| TAPC | |
| β-TNB | |
| TPD15 | |

Among the hole transport layers, for example, TCTA may play a role of preventing diffusion of excitons from the light emitting layer in addition to the hole transporting role. The thickness of the hole transport layer may be 5 nm to 100 nm, for example, 10 nm to 60 nm. When the thickness of the hole transport layer satisfies the above-described range, electroluminescence efficiency of the organic light emitting diode may be improved and luminance may be increased.

The electron injection layer 50 or the electron transport layer has an LUMO (Lowest Unoccupied Molecular Orbital) level between the work function level of the cathode 60 and the LUMO level of the emission layer 40, and functions to increase the efficiency of injection or transport of electrons from the cathode 60 to the light emitting layer 40.

The electron injection layer 50 may be, for example, LiF, NaCl, CsF, $Li_2O$, BaO, $BaF_2$, or Liq (lithium quinolate).

The electron transport layer may include a quinoline derivative, especially tris(8-hydroxyquinoline) aluminum ($Alq_3$), bis(2-methyl-8-quinolinolate)-4-(phenylphenolato) aluminium (Balq), bis(10-hydroxybenzo [h] quinolinato)-beryllium ($Bebg_2$), 2,9-dimethyl-4,7-diphenyl-1,10-phenanthroline: BCP), 4,7-diphenyl-1,10-phenanthroline (Bphen), 2,2',2''-(benzene-1,3,5-triyl)-tris(1-phenyl-1H-benzimidazole) (TPBI), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 2,9-bis(naphthalen-2-yl)-4,7-diphenyl-1,10-phenanthroline (NBphen), tris(2,4,6-trimethyl-3-(pyridin-3-yl)phenyl)borane (3TPYMB), phenyl-dipyrenylphosphine oxide (POPy2), 3,3',5,5'-tetra[(m-pyridyl)-phen-3-yl]biphenyl (BP4mPy), 1,3,5-tri[(3-pyridyl)-phen-3-yl]benzene (TmPyPB), 1,3-bis[3,5-di(pyridin-3-yl)phenyl]benzene (BmPyPhB), bis(10-hydroxybenzo[h]quinolinato)beryllium (Bepq2), diphenylbis(4-(pyridin-3-yl)phenyl)silane (DPPS), 1,3,5-tri(p-pyrid-3-yl-phenyl) benzene (TpPyPB), 1,3-bis[2-(2,2'-bipyridine-6-yl)-1,3,4-oxadiazo-5-yl]benzene (Bpy-OXD), 6,6'-bis [5-(biphenyl-4- yl)-1,3,4-oxadiazo-2-yl]-2,2'-bipyridyl (BP-OXD-Bpy), TSPO1 (diphenylphosphine oxide-4-(triphenylsilyl)phenyl), TPBi (1,3,5-tris(N-Phenylbenzimidazol-2-yl)benzene), tris(8-quinolinorate) aluminum (Alq3), 2,5-diaryl silol derivative (PyPySPyPy), perfluorinated compound (PF-6P), or COTs (Octasubstituted cyclooctatetraene).

The formula of the electron transport material is summarized in Table 2 below.

TABLE 2

| name | chemical formula |
| --- | --- |
| Alq$_3$ | |
| TPBI | |
| PBD | |
| BCP | |
| Bphen | |

TABLE 2-continued

| name | chemical formula |
| --- | --- |
| Balq | |
| Bpy-OXD | |
| BP-OXD-Bpy | |
| TAZ | |
| NTAZ | |

TABLE 2-continued

| name | chemical formula |
|---|---|
| NBphen | |
| 3TPYMB | |
| POPy$_2$ | |

TABLE 2-continued

| name | chemical formula |
|---|---|
| BP4mPy | |
| TmPyPB | |
| BmPyPhB | |
| Bebq₂ | |
| DPPS | |

| name | chemical formula |
|---|---|
| TpPyPB | 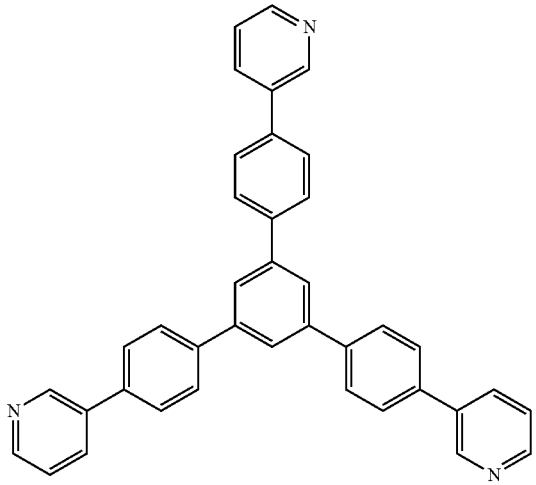 [SMILES: c1cncc(-c2ccc(-c3cc(-c4ccc(-c5cccnc5)cc4)cc(-c4ccc(-c5cccnc5)cc4)c3)cc2)c1] |

The thickness of the electron transport layer may be about 5 nm to 100 nm, for example, 15 nm to 60 nm. When the thickness of the electron transport layer satisfies the above-described range, excellent electron transport characteristics can be obtained without an increase in driving voltage.

The electron injection layer 50 may include a metal oxide. Since the metal oxide has n-type semiconductor properties, it has excellent electron transport capability, and further, it is a material that is not reactive to air or moisture, and may be selected from semiconductor materials having excellent transparency in the visible light.

The electron injection layer 50 is, for example, aluminum doped zinc oxide (AZO), alkali metal (Li, Na, K, Rb, Cs or Fr) doped AZO, TiOx (x is a real number of 1 to 3), indium oxide ($In_2O_3$), tin oxide ($SnO_2$), zinc oxide (ZnO), zinc tin oxide (ZTO), gallium oxide ($Ga_2O_3$), tungsten oxide ($WO_3$), aluminum oxide, titanium oxide, vanadium oxide ($V_2O_5$, vanadium(IV) oxide ($VO_2$), $V_4O_7$, $V_5O_9$, or $V_2O_3$), molybdenum oxide ($MoO_3$ or $MoO_x$), copper oxide (Copper(II) Oxide: CuO), nickel oxide (NiO), copper aluminum oxide (CAO, $CuAlO_2$), zinc rhodium oxide (ZRO, $ZnRh_2O_4$), iron oxide, chromium oxide, bismuth oxide, IGZO (indium gallium zinc oxide), or $ZrO_2$. It may include one or more selected metal oxides, but is not limited thereto. As an example, the electron injection layer 50 may be a metal oxide thin film layer, a metal oxide nanoparticle layer, or a layer including metal oxide nanoparticles in the metal oxide thin film.

The electron injection layer 50 may be formed by using a wet process or a vapor deposition method.

As an example of a wet process, when the electron injection layer 50 is formed by a solution method (ex. a sol-gel method), at least one of a sol-gel precursor of a metal oxide and nanoparticles of metal oxide, and a mixture solution for an electron injection layer including solvent may be deposited on the substrate 10, and then the electron injection layer 50 may be formed by heat treatment. During the heat treatment, the solvent may be removed or the electron injection layer 50 may be crystallized. To provide the mixture solution for the electron injection layer on the substrate 10, known coating method such as a spin coating method, a cast method, a Langmuir-Blodget (LB) method, a spray coating method, a dip coating method, a gravure coating method, a reverse offset coating method, a screen printing method, a slot-die coating method, a nozzle printing method, or a dry transfer printing method may be used, but the present invention is not limited thereto.

The sol-gel precursor of the metal oxide is at least one selected from the group consisting of a metal salt (e.g., metal halide, metal sulfate, metal nitrate, metal perchlorate, metal acetate, metal carbonate, etc.), metal salt hydrate, metal hydroxide, metal alkyl, metal alkoxide, metal carbide, metal acetylacetonate, metal acid, metal acid salt, metal acid hydrate, metal sulfide, metal acetate, metal alkanoate, metal phthalocyanine, metal nitride, and metal carbonate.

When the metal oxide is ZnO, sol-gel precursor of the ZnO may be at least one from group consisting of zinc sulfate, zinc fluoride, zinc chloride, zinc bromide, zinc iodide, zinc perchlorate, zinc hydroxide ($Zn(OH)_2$), zinc acetate ($Zn(CH_3COO)_2$), zinc acetate hydrate ($Zn(CH_3COO)_2 \cdot nH_2O$), diethyl zinc ($Zn(CH_3CH_2)_2$), zinc nitrate ($Zn(NO_3)_2$), zinc nitrate hydrate ($Zn(NO_3)_2 \cdot nH_2O$), zinc carbonate ($Zn(CO_3)$), zinc acetylacetonate ($Zn(CH_3COCHCOCH_3)_2$), and zinc acetylacetonate hydrate ($Zn(CH_3COCHCOCH_3)_2 \cdot nH_2O$), but is not limited thereto.

When the metal oxide is indium oxide ($In_2O_3$), sol-gel precursor of the $In_2O_3$ may be at least selected one from group consisting of indium nitrate hydrate ($In(NO_3)_3 \cdot nH_2O$), indium acetate ($In(CH_3COO)_2$), indium acetate hydrate ($In(CH_3(COO)_2 \cdot nH_2O$), indium chloride (InCl, $InCl_2$ or $InCl_3$), indium nitrate ($In(NO_3)_3$), indium nitrate hydrate ($In(NO_3)_3 \cdot nH_2O$), indium acetylacetonate ($In(CH_3COCHCOCH_3)_2$), and indium acetylacetonate hydrate ($In(CH_3COCHCOCH_3)_2 \cdot nH_2O$).

When the metal oxide is tin oxide ($SnO_2$), sol-gel precursor of the $SnO_2$ is one selected from group consisting of tin acetate ($Sn(CH_3COO)_2$), tin acetate hydrate ($Sn(CH_3COO)_2 \cdot nH_2O$), tin chloride ($SnCl_2$ or $SnCl_4$), tin chloride hydrate ($SnCl_x \cdot nH_2O$), tin acetylacetonate ($Sn(CH_3COCHCOCH_3)_2$), and tin acetylacetonate hydrate ($Sn(CH_3COCHCOCH_3)_2 \cdot nH_2O$).

When the metal oxide is gallium oxide ($Ga_2O_3$), sol-gel precursor of the $Ga_2O_3$ is at least one selected from group consisting of gallium nitrate ($Ga(NO_3)_3$), gallium nitrate hydrate (Ga(NO$_3$)$_3$·nH$_2$O), gallium acetylacetonate (Ga(CH$_3$COCHCOCH$_3$)$_3$), gallium acetylacetonate hydrate (Ga(CH$_3$COCHCOCH$_3$)$_3$·nH$_2$O), and gallium chloride (Ga$_2$Cl$_4$, or GaCl$_3$) may be used.

When the metal oxide is tungsten oxide (WO$_3$), sol-gel precursor of WO$_3$ is one selected from group consisting of tungsten carbide (WC), tungstic acid powder (H$_2$WO$_4$), tungsten chloride (WCl$_4$, or WCl$_6$), tungsten isopropoxide (W(OCH(CH$_3$)$_2$)$_6$), sodium tungstate (Na$_2$WO$_4$), sodium tungstate hydrate (Na$_2$WO$_4$·nH$_2$O), ammonium tungstate ((NH$_4$)$_6$H$_2$W$_{12}$O$_{40}$), ammonium tungstate hydrate ((NH$_4$)$_6$H$_2$W$_{12}$O$_{40}$·nH$_2$O), and tungsten ethoxide (W(OC$_2$H$_5$)$_6$).

When the metal oxide is aluminum oxide, sol-gel precursor of the aluminum oxide may be one selected from group consisting of aluminum chloride (AlCl$_3$), aluminum nitrate (Al(NO$_3$)$_3$), aluminum nitrate hydrate (Al(NO$_3$)$_3$·nH$_2$O), and aluminum butoxide (Al(C$_2$H$_5$CH(CH$_3$)O)).

When the metal oxide is titanium oxide, sol-gel precursor of the titanium oxide is at least one selected from group consisting of titanium isopropoxide (Ti(OCH(CH$_3$)$_2$)$_4$), titanium chloride (TiCl$_4$), titanium ethoxide (Ti(OC$_2$H$_5$)$_4$)), and titanium butoxide (Ti(OC$_4$H$_9$)$_4$).

When the metal oxide is vanadium oxide, the sol-gel precursor of vanadium oxide may be one selected from group consisting of vanadium isopropoxide (VO(OC$_3$H$_7$)$_3$), ammonium vanadate (NH$_4$VO$_3$), vanadium acetylacetonate (V(CH$_3$COCHCOCH$_3$)$_3$), and vanadium acetylacetonate hydrate (V(CH$_3$COCHCOCH$_3$)$_3$·nH$_2$O).

When the metal oxide is molybdenum oxide, sol-gel precursor of the molybdenum oxide is any one selected from group consisting of molybdenum isopropoxide (Mo(OC$_3$H$_7$)$_5$), molybdenum chloride isopropoxide (MoCl$_3$(OC$_3$H$_7$)$_2$), ammonium molybdenate ((NH$_4$)$_2$MoO$_4$), and ammonium molybdenate hydrate ((NH$_4$)$_2$MoO$_4$·nH$_2$O).

When the metal oxide is copper oxide, sol-gel precursor the copper oxide may be one selected from group consisting of copper chloride (CuCl or CuCl$_2$), copper chloride hydrate (CuCl$_2$·nH$_2$O), copper acetate (Cu(CO$_2$CH$_3$), or Cu(CO$_2$CH$_3$)$_2$), copper acetate hydrate (Cu(CO$_2$CH$_3$)$_2$·nH$_2$O), copper acetylacetonate (Cu(C$_5$H$_7$O$_2$)$_2$), copper nitrate (Cu(NO$_3$)$_2$), copper nitrate hydrate (Cu(NO$_3$)$_2$·nH$_2$O), copper bromide (CuBr or CuBr$_2$), copper carbonate (CuCO$_3$Cu(OH)$_2$), copper sulfide (Cu$_2$S or CuS), copper phthalocyanine (C$_{32}$H$_{16}$N$_8$Cu), copper trifluoroacetate (Cu(CO$_2$CF$_3$)$_2$), copper isobutyrate (C$_8$H$_{14}$CuO$_4$), copper ethyl acetoacetate (C$_{12}$H$_{18}$CuO$_6$), copper2-ethylhexanoate ([CH$_3$(CH$_2$)$_3$CH(C$_2$H$_5$)CO$_2$]$_2$Cu), copper fluoride (CuF$_2$), copper formate hydrate ((HCO$_2$)$_2$Cu·nH$_2$O), copper gluconate (Cl$_2$H$_{22}$CuO$_{14}$), copper hexafluoroacetylacetonate (Cu(C$_5$HF$_6$O$_2$)$_2$), copper hexafluoroacetylacetonate hydrate (Cu(C$_5$HF$_6$O$_2$)$_2$·nH$_2$O), copper methoxide (Cu(OCH$_3$)$_2$), copper neodecanoate (C$_{10}$H$_{19}$O$_2$Cu), copper perchlorate hydrate (Cu(ClO$_4$)$_2$·6H$_2$O), copper sulfate (CuSO$_4$), copper sulfate hydrate (CuSO$_4$·nH$_2$O), copper tartrate hydrate ([—CH(OH)CO$_2$]$_2$Cu nH$_2$O), copper trifluoroacetylacetonate (Cu(C$_5$H$_4$F$_3$O$_2$)$_2$), copper trifluoromethanesulfonate ((CF$_3$SO$_3$)$_2$Cu), and tetraamine copper sulfate hydrate (Cu(NH$_3$)$_4$SO$_4$·H$_2$O).

When the metal oxide is nickel oxide, sol-gel precursor of the nickel oxide is at least one selected from group consisting of nickel chloride (NiCl$_2$), nickel chloride hydrate (NiCl$_2$ nH$_2$O), nickel acetate hydrate (Ni(OCOCH$_3$)$_2$·4H$_2$O), nickel nitrate hydrate (Ni(NO$_3$)$_2$·6H$_2$O), nickel acetylacetonate (Ni(C$_5$H$_7$O$_2$)$_2$), nickel hydroxide (Ni(OH)$_2$), nickel phthalocyanine (C$_{32}$H$_{16}$N$_8$Ni), and nickel carbonate hydrate (NiCO$_3$·2Ni(OH)$_2$·nH$_2$O).

When the metal oxide is iron oxide, the sol-gel precursor of iron oxide is at least one selected from group consisting of iron acetate (Fe(CO$_2$CH$_3$)$_2$), iron chloride (FeCl$_2$, or FeCl$_3$), iron chloride hydrate (FeCl$_3$·nH$_2$O), iron acetylacetonate (Fe(C$_5$H$_7$O$_2$)$_3$), iron nitrate hydrate (Fe(NO$_3$)$_3$·9H$_2$O), iron phthalocyanine (C$_{32}$H$_{16}$FeN$_8$), and iron oxalate hydrate (Fe(C$_2$O$_4$)·nH$_2$O or Fe$_2$(C$_2$O$_4$)$_3$·6H$_2$O).

When the metal oxide is chromium oxide, sol-gel precursor of the chromium oxide is at least one selected from group consisting of chromium chloride (CrCl$_2$, or CrCl$_3$), chromium chloride hydrate (CrCl$_3$·nH$_2$O), chromium carbide (Cr$_3$C$_2$), chromium acetylacetonate (Cr(C$_5$H$_7$O$_2$)$_3$, chromium nitrate hydrate (Cr(NO$_3$)$_3$·nH$_2$O), chromic acetic acid hydroxide (CH$_3$CO$_2$)$_7$Cr$_3$(OH)$_2$, and chromium acetate hydrate ([(CH$_3$CO$_2$)$_2$Cr·H$_2$O]$_2$).

In the case where the metal oxide is bismuth oxide, sol-gel precursor of the bismuth oxide is at least one selected from group consisting of bismuth chloride (BiCl$_3$), bismuth nitrate hydrate (Bi(NO$_3$)$_3$·nH$_2$O), bismuth acetic acid ((CH$_3$CO$_2$)$_3$Bi), and bismuth carbonate ((BiO)$_2$CO$_3$).

When the metal oxide nanoparticles are contained in the mixture solution for the electron injection layer, the average particle diameter of the metal oxide nanoparticles may be 10 nm to 100 nm.

The solvent may be a polar solvent or a non-polar solvent. For example, the polar solvent may include alcohols or ketones, and the nonpolar solvent may include aromatic hydrocarbons, alicyclic hydrocarbons, or aliphatic hydrocarbon-based organic solvents. For example, the solvent may be one selected from group consisting of ethanol, dimethylformamide, ethanol, methanol, propanol, butanol, isopropanol, methyl ethyl ketone, propylene glycol (mono) methyl ether (PGM), isopropyl cellulose (IPC), ethylene carbonate (EC), methyl cellosolve (MC), ethyl cellosolve, 2-methoxy ethanol and ethanol amine, but is not limited thereto.

For example, when the electron injection layer 50 made of ZnO is formed, the mixture solution for the electron injection layer may contains a precursor of ZnO of zinc acetate dehydrate, and solvent having combination of 2-methoxy ethanol and ethanol amine, but is not limited thereto.

The heat treatment conditions may be varied depending on the type and content of the selected solvent, but it is generally preferably performed within the range of 100° C. to 350° C. and 0.1 hour to 1 hour. When temperature and time for heat treatment satisfy these ranges, the solvent may be easily removed and the device may not be deformed.

When the electron injection layer 50 is formed by evaporation method, a variety of known method may be used, which is a vapor deposition method, electron beam deposition, thermal evaporation, sputter deposition, atomic layer deposition, or chemical vapor deposition. The deposition conditions vary depending on the target compound, and the structure and thermal properties of the target layer. For example, the deposition is preferably performed within temperature range of 25° C. to 1,500° C., specifically 100° C. to 500° C., within a vacuum degree range of $10^{-10}$ torr to $10^{-3}$ torr, and within the deposition rate range of 0.01 Å/sec to 100 Å/sec.

The thickness of the electron injection layer 50 may be 10 nm to 100 nm, more specifically, 20 nm to 50 nm.

The hole injection layer 30, the hole transport layer, the electron injection layer 50, or the electron transport layer may include materials used in conventional organic light emitting diodes.

The hole injection layer 30, the hole transport layer, the electron injection layer 50, or the electron transport layer may be formed by using at least one known process selected from group consisting of a spin coating method, a spray method, a dip coating method, a bar coating method, a nozzle printing method, a slot-die coating method, a gravure printing method, a cast method, and a Langmuir-Blodgett (LB) method. In this case, process conditions and coating conditions for forming a thin film may vary depending on the target compound, the structure and thermal properties of the target layer, and the like.

On the other hand, in the light emitting device, a feature of the present invention is that at least one charge transport layer selected from the group consisting of the hole injection layer 30, the hole transport layer, the electron transport layer, and the electron injection layer 50 includes a perovskite thin film.

Specifically, the present invention provides an anode and a cathode, a light emitting layer disposed between the anode and the cathode, at least one first charge transport layer among a hole injection layer and a hole transport layer disposed between the anode and the light emitting layer, and at least one second charge transport layer among an electron injection layer and an electron transport layer disposed between the light emitting layer and the cathode, wherein at least one of a first charge transport layer and a second charge transport layer adjacent to the emitting layer is characterized to be perovskite thin film.

Figure 5:
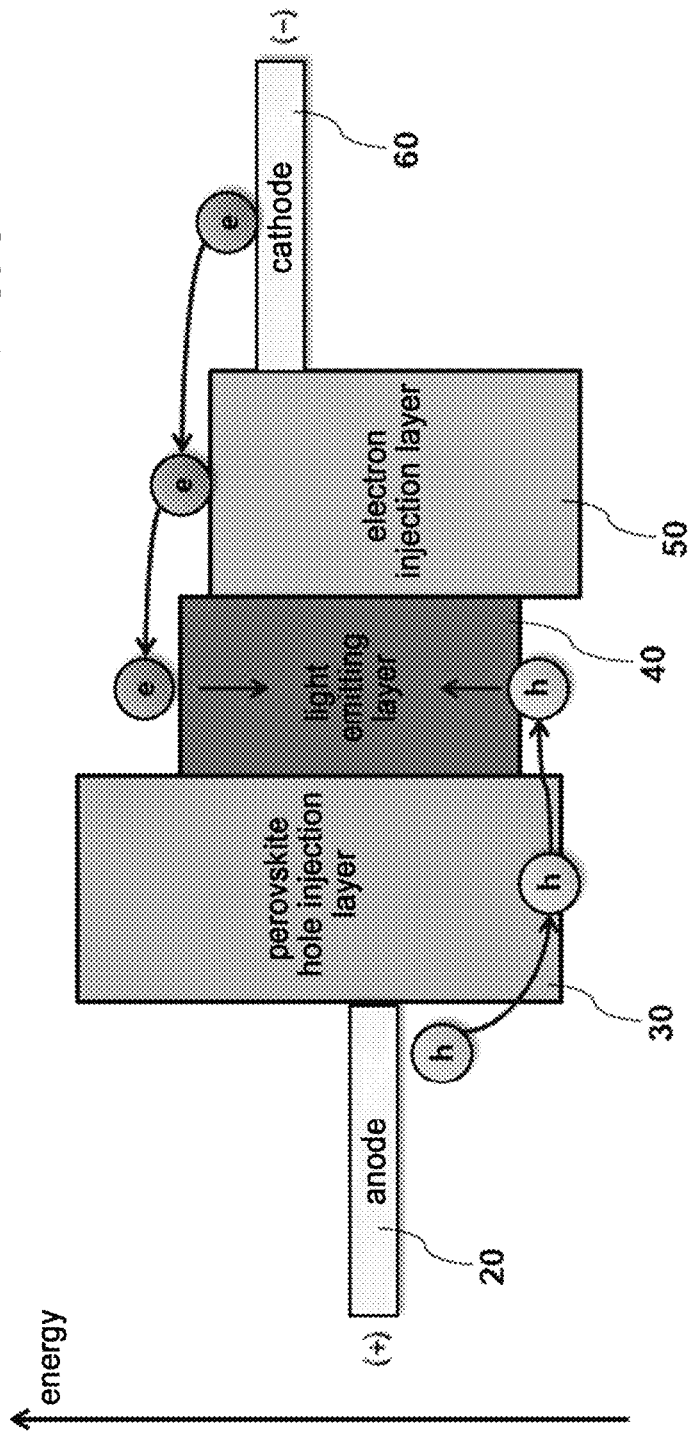
FIG. 5 is diagram showing an energy level of a light emitting device (normal structure) including a perovskite hole injection layer according to an embodiment of the present invention.
Figure 6:
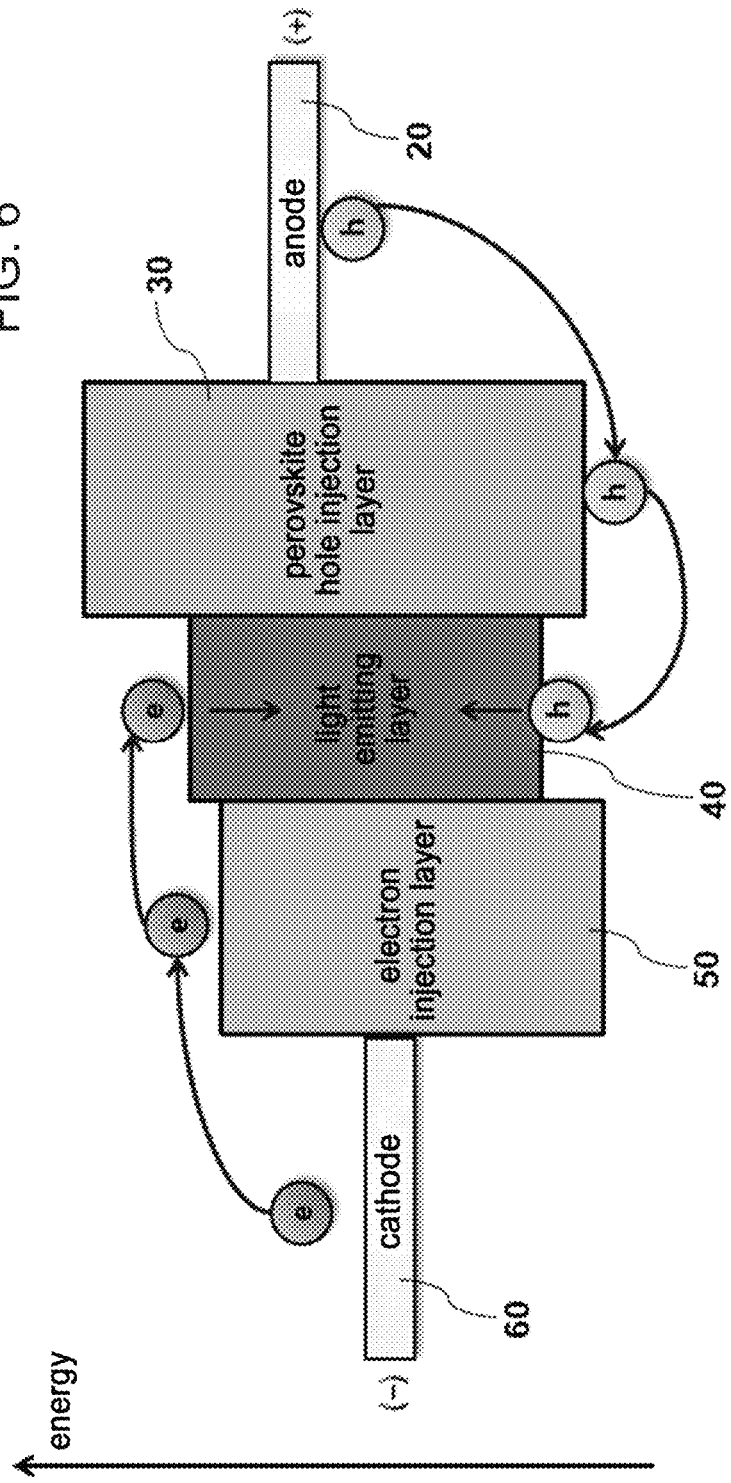
FIG. 6 is diagram showing an energy level of a light emitting device (inverted structure) including a perovskite hole injection layer according to an embodiment of the present invention.

In the light emitting device according to an embodiment of the present invention, the first charge transport layer (for example, the hole injection layer 30) may be a perovskite thin film (referring to FIGS. 5 and 6).

Figure 7:
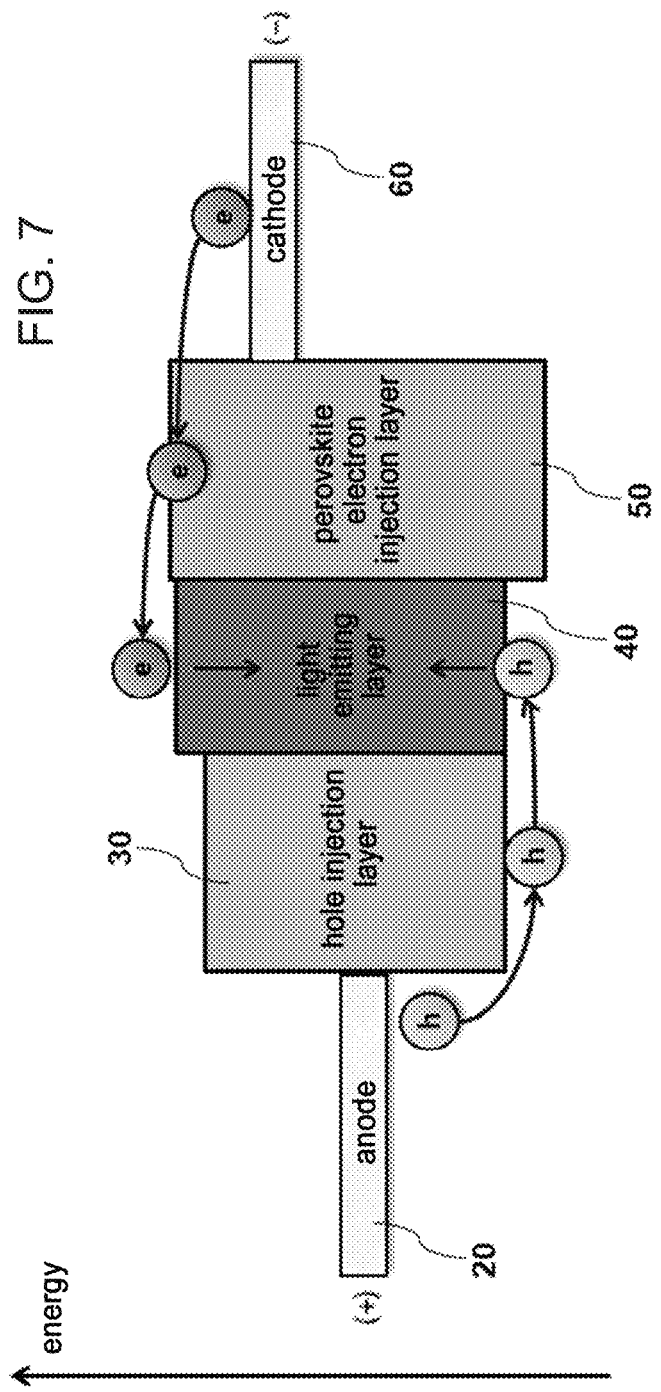
FIG. 7 is diagram showing an energy level of a light emitting device (normal structure) including a perovskite electron injection layer according to an embodiment of the present invention.
Figure 8:
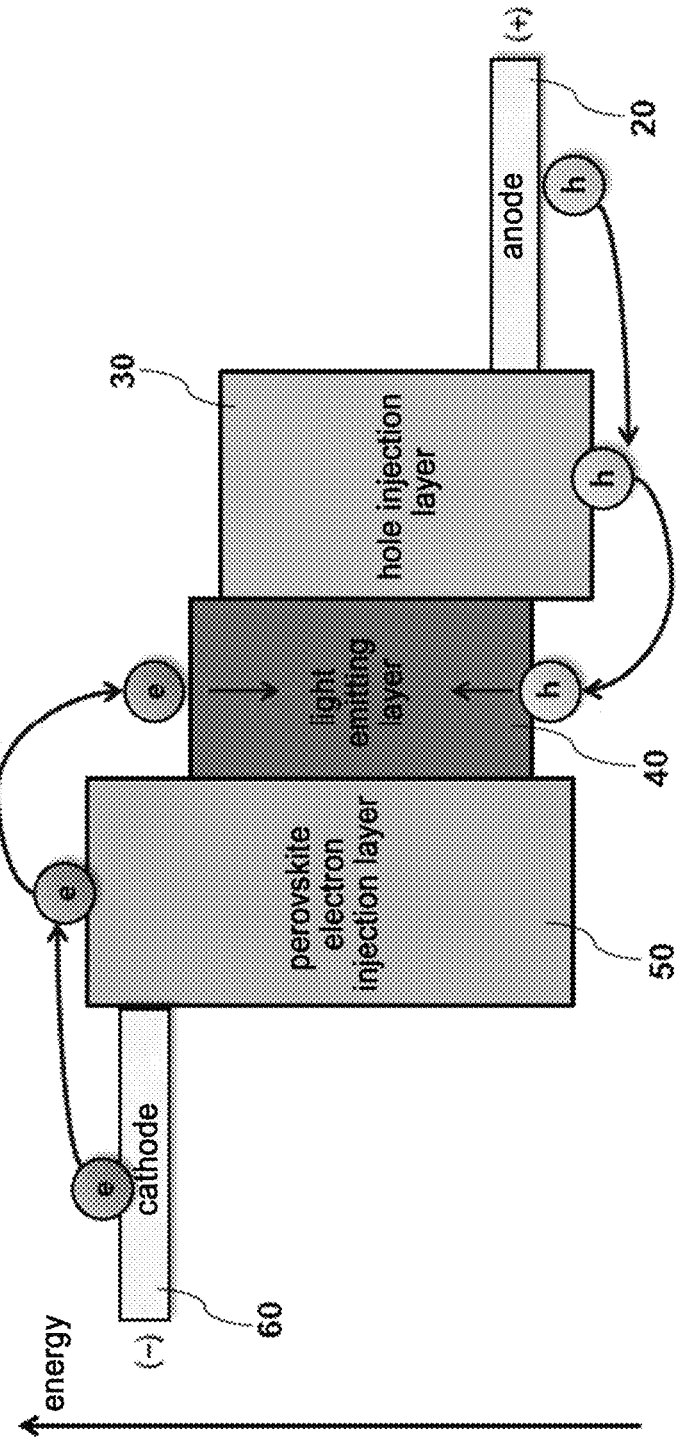
FIG. 8 is diagram showing an energy level of a light emitting device (inverted structure) including a perovskite electron injection layer according to an embodiment of the present invention.

In the light emitting device according to an embodiment of the present invention, the second charge transport layer (for example, the electron injection layer 50) may be a perovskite thin film (referring to FIGS. 7 and 8).

In the light emitting device according to an embodiment of the present invention, both the first charge transport layer (for example, hole injection layer 30) and the second charge transport layer (for example, electron injection layer 50) may be a perovskite thin film. The perovskite thin films constituting the first and second charge transport layers may be the same (see FIGS. 9 and 10) or different (see FIGS. 11 and 12) from each other.

In the display industry, the metal halide perovskite thin film used in perovskite light emitting devices has been used only as a light emitting layer. However, inventors of the present invention have found that the metal halide perovskite is very promising material as a charge transport layer as well as a light emitting layer. Because the metal halide perovskite has an energy level similar to that of an organic semiconductor material used in a light emitting device and has higher charge mobility than that of an organic semiconductor, the metal halide perovskite may be used as the charge transport layer.

The perovskite includes a structure of $ABX_3$, $A_2BX_4$, $ABX_4$, or $A_{n-1}Pb_nX_{3n+1}$ (n is an integer between 2 and 6), wherein A is an organic ammonium ion, an organic amidinium ion, an organic phosphonium ion or alkali metal ions, or its derivative, B is a transition metal, rare earth metal, alkaline earth metal, organic material, inorganic material, ammonium or derivative, or, or a combination thereof, and X may be a halogen ion or a combination of different halogen ions.

Figure 3:
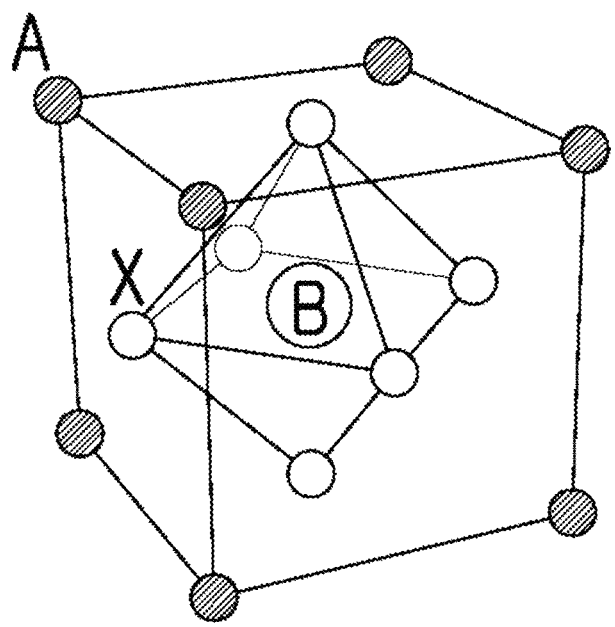
FIG. 3 is a schematic diagram showing the crystal structure of perovskite.

FIG. 3 is a schematic diagram showing the crystal structure of perovskite.

The perovskite may be a metal halide perovskite, and the crystal structure of the metal halide perovskite is consisted of a center metal (B) in the center, six halogen elements (X) located on all surfaces of the hexahedron, and A (organic ammonium, organic amidinium, organic phosphonium or alkali metal) positioned at all vertexes of the hexahedron. The six halogen elements (X) and the A form a face centered cubic (FCC) and the center metal (B) and A form a body centered cubic (BCC). In crystal structure, angle between neighboring surfaces of the hexahedron is 90°, and horizontal length, vertical length, and height are mutually the same, so that the crystal structure is a cubic structure. Furthermore, the crystal structure may be tetragonal structure in which the horizontal length and vertical length are mutually the same and height is different from the horizontal length or vertical length.

Preferably, A may be $CH(NH_2)_2$, $C_xH_{2x+1}(CNH_3)$, $(CH_3NH_3)_n$, $((C_xH_{2x+1})_nNH_3)_n(CH_3NH_3)_n$, $R(NH_2)_2$ (R=alkyl), $(C_nH_{2n+1}NH_3)_n$, $CF_3NH_3$, $(CF_3NH_3)_n$, $((C_xF_{2x+1})_nNH_3)_n(CF_3NH_3)_n$, $((C_xF_{2x+1})_nNH_3)_n$, $(C_nF_{2n+1}NH_3)_n$ (n and x are 1 an integer of 1 to 100), Na, K, Rb, Cs, Fr, or a combination or derivative thereof.

Preferably, B may be Pb, Mn, Cu, Ga, Ge, In, Al, Sb, Bi, Po, Sn, Eu, Yb, Ni, Co, Fe, Cr, Pd, Cd, Ca, Sr, organic ammonium, inorganic ammonium, organic cation, or a combination or derivative thereof.

Preferably, X may be Cl, Br, I, or a combination thereof.

In addition, the crystal in the perovskite thin film may be in the form of a spherical, cylindrical, elliptical, or polygonal column.

In addition, the band gap energy of the crystal in the perovskite thin film may be 1 eV to 5 eV.

In addition, the size of the crystal in the perovskite thin film may be 1 nm to 5 μm. If the size of the perovskite crystal exceeds 5 μm, there may be a fundamental problem that excitons are separated into free charges and disappeared without generating light due to thermal ionization and delocalization of charge carriers at room temperature.

In addition, the thickness of the perovskite thin film may be 10 nm to 5 μm.

The perovskite thin film has been mainly manufactured through a solution process. However, the solution process has a disadvantage that the uniformity of the thin film to be formed is poor, thickness control is not easy, and materials that can be mixed are limited depending on the characteristics of the solvent.

In light emitting device having the metal halide perovskite, the greatest impediment factor of performance is a non-uniform thin film. In a thin film device composed of stacked thin films, the non-uniformity of the thin film is one of the factors that significantly deteriorate the device performance by breaking the charge balance and generating a leakage current. In particular, since the morphology of the thin film of the metal halide perovskite varies greatly depending on the conditions for forming the thin film and the surrounding environment, the uniformity of the thin film is very important in the performance of the perovskite light emitting device. An example of a non-uniform thin film is a thin film formed by a general spin coating process that forms $CH_3NH_3PbBr_3$. If an additional nanocrystal pinning process is not used, there is a problem that a thin film is formed with a morphology of isolated crystals due to spontaneous crystallization [Science 2015, 350, 1222].

However, in the case of using the nanocrystal pinning process, the film quality of the thin film can be greatly influenced by the processing environment, so even if the same process is used, there is a disadvantage that the film quality has a large deviation. In addition, since the film quality of the thin film is improved only in a region where nanocrystal pinning process is performed, there may be limitations in implementing a large area device. So, there has not been an example of manufacturing the perovskite thin film for charge transport layer by an evaporation process.

The position of the electron-hole recombination zone in the device, that is, the emission spectrum of the device, can be influenced by the thickness of the layer and can vary depending on the energy level of the material used.

Accordingly, in the present invention, a perovskite thin film is prepared by placing two perovskite precursors (AX and $BX_2$) into different crucibles respectively and evaporating the precursors from the crucibles for deposition either simultaneously (co-deposition) or sequentially.

Vacuum evaporation may be preferably used as the deposition method, and in this case, the vacuum evaporation may be performed in high and low vacuum. In an embodiment of the present invention, a thin film is formed using the vacuum evaporator shown in FIG. 4.

Figure 4:
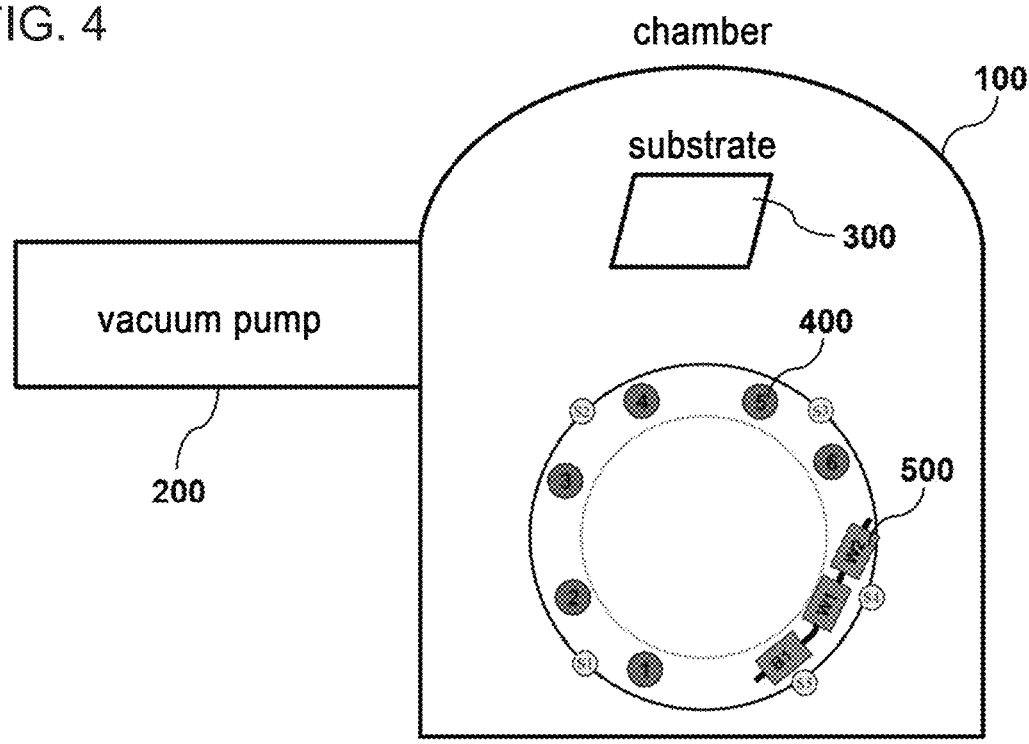
FIG. 4 is a schematic diagram showing the structure of a high vacuum evaporator for manufacturing a perovskite thin film according to an embodiment of the present invention.

Referring to FIG. 4, the vacuum evaporator includes a chamber 100 and a vacuum pump 200. In the chamber 100, a substrate portion 300, crucibles 400 and 500, and a heat source are prepared. A substrate for deposition is placed on the substrate portion 300, and crucibles 400 and 500 contain perovskite precursors, and the heat source positions under the crucibles 400 and 500 to heat the crucibles 400 and 500. In the vacuum deposition method, the substrate is placed on the upper side in the chamber 100 of the vacuum evaporator, and the AX compound and the $BX_2$ compound, which are perovskite precursors, are respectively loaded into the crucibles on the lower side. When perovskite precursors are heated by an electron beam or the like, vaporized precursors form crystals directly on the substrate to form a perovskite thin film.

The perovskite thin film according to the present invention has uniformity since the synthesis of perovskite is directly conducted to form crystals on the substrate by co-depositing or sequentially depositing perovskite precursors, the thickness of the thin film can be easily controlled, and the energy level of the thin film can be adjusted, so that the thin film may be manufactured to have an energy level suitable for a charge transport layer such as a hole injection layer or an electron injection layer.

In the present invention, the energy level means the magnitude of energy. Therefore, even when the energy level is denoted in the negative (−) direction from the vacuum level, the energy level is interpreted to mean the absolute value of the energy value. For example, the HOMO energy level of the organic small molecule host means the distance from the vacuum level to the highest occupied molecular orbital. In addition, the LUMO energy level of the organic small molecule host means the distance from the vacuum level to the lowest unoccupied molecular orbital.

In the present invention, the conduction band minimum (CBM) of perovskite refers to the lowermost end of the conduction band of the material, and the valence band maximum (VBM) of perovskite refers to the uppermost end of the valence band of the material. The difference between the CBM and VBM is referred to as a bandgap.

In the present invention, the measurement of HOMO energy level and VBM of perovskite can use UV photoelectron spectroscopy (UPS), which measures the ionization potential of a substance by irradiating UV on the surface of a thin film, and detecting electrons that escape from the surface of a thin film. Alternatively, the measurement of the HOMO energy level may use cyclic voltammetry (CV) in which a substance to be measured is dissolved in a solvent together with an electrolyte, and then an oxidation potential is measured through a voltage sweep. In addition, the PYSA (Photoemission Yield Spectrometer in Air) method can be used to measure the ionization potential in the air by using a machine provided by AC-3 (RKI).

In the present invention, the LUMO energy level and the CBM of the perovskite can be obtained through the measurement of IPES (Inverse Photoelectron Spectroscopy) or electrochemical reduction potential. IPES is a method of determining the LUMO energy level by irradiating an electron beam onto a thin film and measuring the light emitted from the thin film. In addition, in the measurement of the electrochemical reduction potential, a reduction potential can be measured through a voltage sweep after dissolving a substance to be measured in a solvent together with an electrolyte. Alternatively, the LUMO energy level can be calculated by using the HOMO energy level and the singlet energy level obtained by measuring the UV absorption spectrum of the target material.

Specifically, the HOMO energy level of the present invention is measured through an AC-3 (RKI) measuring instrument after vacuum deposition of a target material to a thickness of 50 nm or more on an ITO substrate. In addition, the LUMO energy level is determined by measuring the absorption spectrum (Abs.) and photoluminescence spectrum (PL) of the prepared sample, calculating the edge energy of Abs. spectrum (or the peak of PL), and taking the edge energy as a band gap (Eg), and the LUMO energy level is calculated by subtracting the band gap from the HOMO energy level measured at AC-3.

When $MAPbBr_3$ (MA is methyl ammonium, $CH_3NH_3$) is used as perovskite according to an embodiment of the present invention, the VBM of the $MAPbBr_3$ is (−)5.9 eV, and the CBM is (−)3.6 eV. At this time, TPBI can be said that the HOMO energy level is (−)6.4 eV, which is lower than the VBM of perovskite ($MAPbBr_3$), and the LUMO energy level is (−)2.5 eV, which is higher than the CBM of perovskite ($MAPbBr_3$).

Hereinafter, energy levels of a light emitting device including a perovskite charge transport layer according to a preferred embodiment of the present invention are shown.

FIG. 5 shows an energy level of a light emitting device (normal structure) including a perovskite hole injection layer according to an embodiment of the present invention, wherein the band gap of the perovskite hole injection layer is larger than that of the light emitting layer represents.

FIG. 6 shows an energy level of a light emitting device in which a band gap of the perovskite hole injection layer is larger than that of the light emitting layer in a light emitting device (inverted structure) including a perovskite hole injection layer according to an embodiment of the present invention.

FIG. 7 shows an energy level of a light emitting device (normal structure) including a perovskite electron injection layer according to an embodiment of the present invention, wherein the band gap of the perovskite electron injection layer is larger than that of the light emitting layer represents.

FIG. 8 shows an energy level of a light emitting device (inverted structure) in which a band gap of the perovskite electron injection layer is larger than that of the light emitting layer in a light emitting device including a perovskite electron injection layer according to an embodiment of the present invention.

Figure 9:
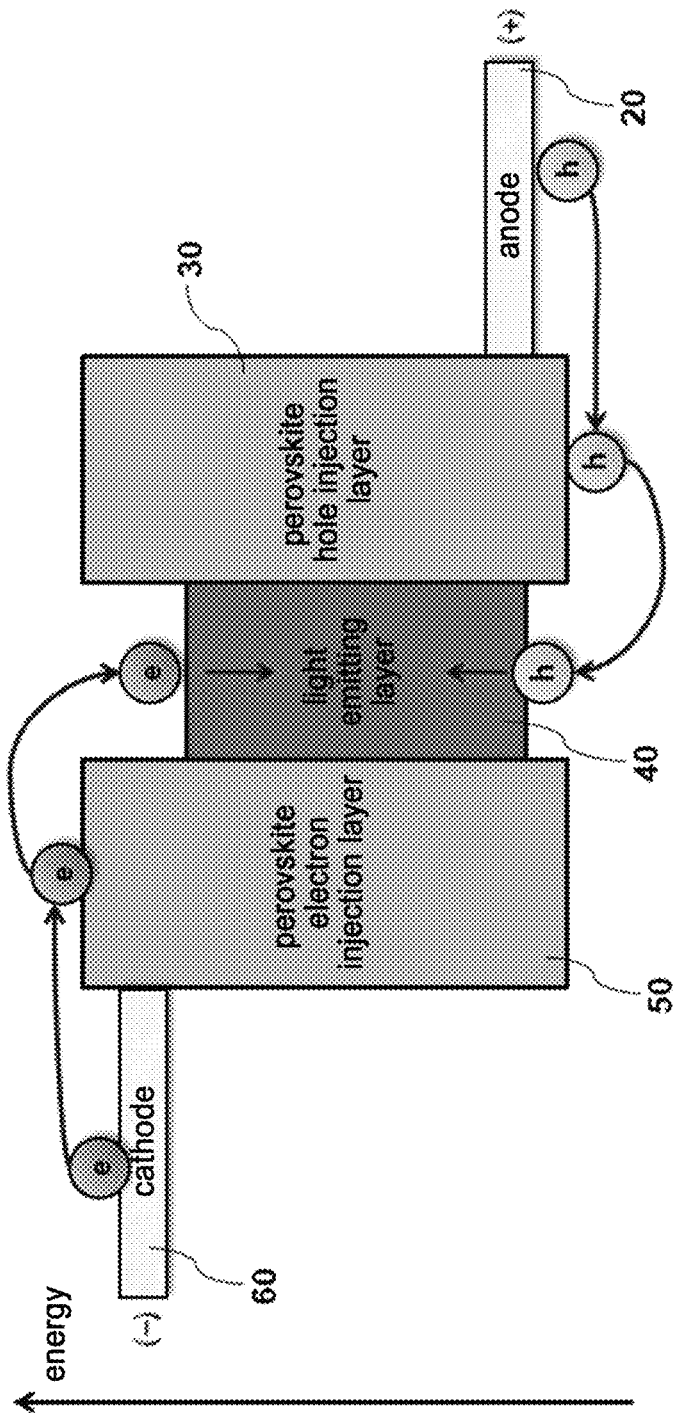
FIG. 9 is diagram showing an energy level of a light emitting device (inverted structure) including a first perovskite hole injection layer and a second perovskite electron injection layer according to an embodiment of the present invention.

FIG. 9 shows an energy level of a light emitting device (inverted structure) including a first perovskite hole injection layer and a second perovskite electron injection layer according to an embodiment of the present invention, wherein the first perovskite hole injection layer and the second perovskite electron injection layer are the same with each other.

Figure 10:
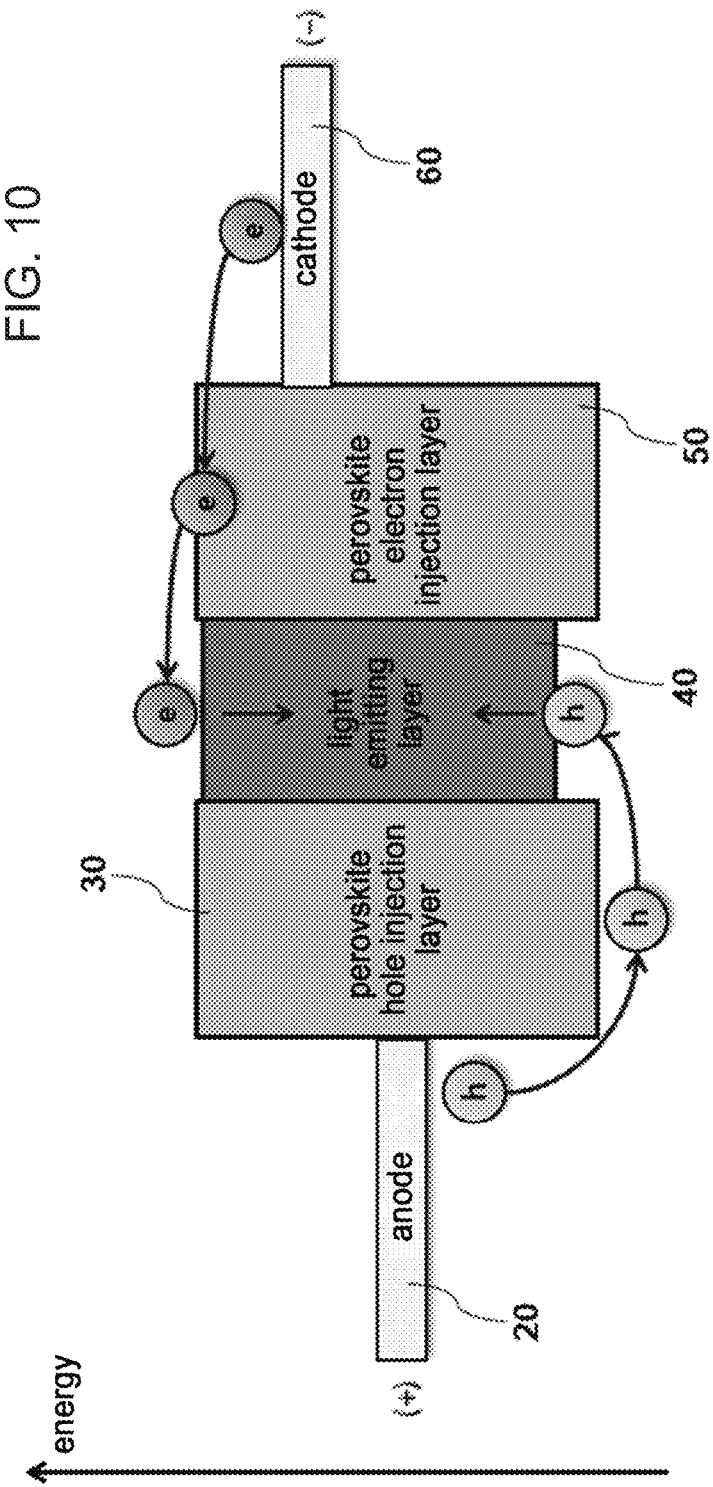
FIG. 10 is diagram showing an energy level of a light emitting device (normal structure) including a first perovskite hole injection layer and a second perovskite electron injection layer according to an embodiment of the present invention.

FIG. 10 shows an energy level of light emitting device (normal structure) including a first perovskite hole injection layer and a second perovskite electron injection layer according to an embodiment of the present invention, wherein the first perovskite hole injection layer and the second perovskite electron injection layer are the same with each other.

Figure 11:
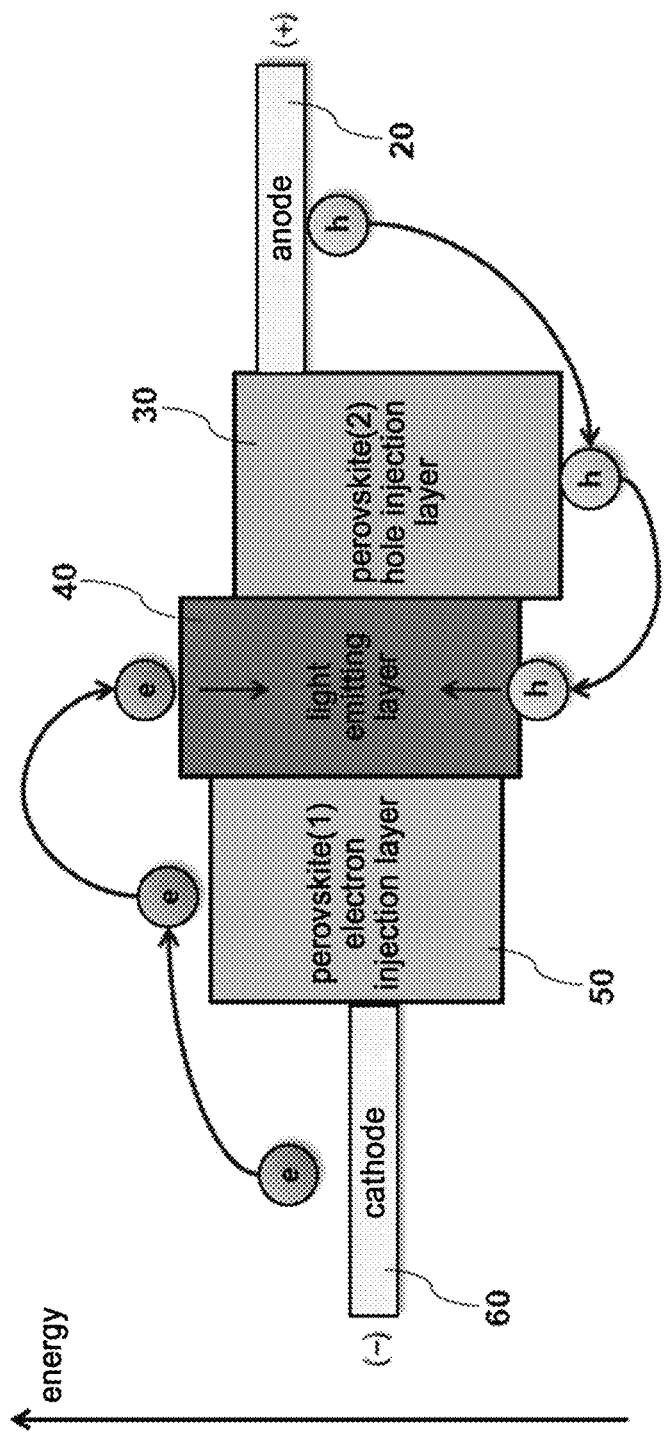
FIG. 11 is the other diagram showing an energy level of a light emitting device (inverted structure) including a first perovskite hole injection layer and a second perovskite electron injection layer according to an embodiment of the present invention.

FIG. 11 shows an energy level of a light emitting device (inverted structure) including a first perovskite hole injection layer and a second perovskite electron injection layer according to an embodiment of the present invention, wherein the first perovskite hole injection layer is different from the second perovskite electron injection layer.

FIG. 12 shows an energy level of a light emitting device (normal structure) including a first perovskite hole injection layer and a second perovskite electron injection layer according to an embodiment of the present invention, wherein the first perovskite hole injection layer is different from the second perovskite electron injection layer.

As shown FIG. 5 to FIG. 12, in the light emitting device according to the present invention, when the perovskite thin film is used as a hole injection layer or a hole transport layer, the energy level of VBM of the perovskite thin film is preferably lower than the energy level of the HOMO of the light emitting layer 40. When a forward bias is applied to the light emitting device under such an energy level condition, it becomes easy for holes from the anode 20 to flow into the light emitting layer 40 via the perovskite thin film.

In addition, in the light emitting device according to the present invention, when the perovskite thin film is used as an electron injection layer or an electron transport layer, the energy level of CBM of the perovskite thin film is preferably higher than the energy level of LUMO of the light emitting layer. When a forward bias is applied to the light emitting device under such an energy level condition, it becomes easy for electrons from the cathode 60 to flow into the light emitting layer 40 via the perovskite thin film.

In addition, the present invention provides a method of manufacturing a light emitting device including a perovskite charge transport layer.

The method of manufacturing a light emitting device including the perovskite charge transport layer includes steps of forming an anode on a substrate, forming at least one first charge transport layer selected from a hole injection layer and a hole transport layer on the anode, forming a light emitting layer on the first charge transport layer, forming at least one second charge transport layer selected from an electron injection layer and an electron transport layer on the light emitting layer, and forming a cathode on the second charge transport layer.

In addition, the light emitting device including the perovskite charge transport layer may be manufactured in an inverted structure. The method of manufacturing the light emitting device of inverted structure may include steps of forming a cathode on a substrate, forming at least one second charge transport layer selected from an electron injection layer and an electron transport layer on the cathode, forming a light emitting layer on the second charge transport layer, forming at least one first charge transport layer selected from a hole injection layer and a hole transport layer on the light emitting layer, and forming an anode on the first charge transport layer.

At least one of the steps of forming the first charge transport layer and the second charge transport layer is a step of forming a perovskite thin film by using a evaporation method.

In the method of manufacturing a light emitting device according to the present invention, besides forming a perovskite thin film, steps of forming an anode, a first charge transport layer, a second charge transport layer, a light emitting layer, and a cathode may be performed according to a method known in the art, thus detailed description is omitted.

In the method of manufacturing a light emitting device according to the present invention, the step of forming a perovskite thin film is desirable to deposit to form crystals directly on the substrate by using a evaporation method. When the deposition method is used, two precursors (AX and $BX_2$) of perovskite are respectively put into different crucibles.

As the deposition method, vacuum evaporation, thermal deposition, flash deposition, laser deposition, chemical vapor deposition, atomic layer deposition, physical vapor deposition, physical-chemical co-evaporation deposition, sequential vapor deposition, or solution process-assisted thermal deposition, etc. can be used.

Vacuum evaporation may be preferably used as the deposition method, and the vacuum evaporation may be performed in high and low vacuum.

The perovskite thin film in the light emitting device according to the present invention may form a uniform thin film while the synthesis of perovskite is directly formed on the substrate by co-depositing or sequentially depositing perovskite precursors. In addition, it is easy to control the thickness of the thin film, and by adjusting the energy level, it can be manufactured to have an energy level suitable for the charge transport layer of the hole injection layer or the electron injection layer in the light emitting device.

Hereinafter, a preferred manufacturing example is presented to aid the understanding of the present invention. However, the following manufacturing examples are only to aid understanding of the present invention, and the present invention is not limited by the following manufacturing examples.

Manufacturing Example 1: Manufacture of Light Emitting Device (Normal Structure) Including Perovskite Hole Transport Layer First, an ITO substrate (a glass substrate coated with an ITO anode) is prepared, and then a conductive material PEDOT:PSS (Al4083 from Heraeus) is spin-coated on the ITO anode and then heat-treated at 150° C. for 30 minutes to form hole injection layer of 50 nm thickness.

Next, in a high vacuum thermal evaporator as shown in FIG. 4, CsCl and $PbCl_2$ are co-deposited on the hole injection layer through thermal deposition in a high vacuum state ($1 \times 10^{-7}$ Torr) so that perovskite hole transport layer ($CsPbCl_3$) is formed.

Next, on the perovskite hole transport layer, Ir(ppy)$_2$(acac) that is an organic small molecule light emitting material as a dopant, and CBP that is an organic small molecule material as a host, are deposited at a ratio of 3:100 by using vacuum thermal deposition, so that a light emitting layer having 5 nm thickness is formed.

Next, 1,3,5-Tris(1-phenyl-1H-benzimidazol-2-yl)benzene (TPBI) having a thickness of 50 nm is deposited on the light emitting layer in a high vacuum of $1\times10^{-6}$ Torr or less to form an electron transport layer. Then, LiF is deposited thereon to form an electron injection layer of 1 nm thickness, and aluminum is deposited thereon to form anode of 100 nm thickness to fabricate a light emitting device.

The fabricated light emitting device exhibits the highest luminance of about 20,000 cd/m² and the highest current efficiency of about 40 cd/A.

Manufacturing Example 2: Manufacture of Light Emitting Device (Inverted Structure) Including Perovskite Hole Transport Layer First, an ITO substrate (a glass substrate coated with an ITO cathode) is prepared, and then a ZnO precursor that is a conductive material, is spin-coated on the ITO cathode, followed by heat treatment at 150° C. for 30 minutes to form an electron injection layer having a thickness of 50 nm.

On the electron injection layer, 1,3,5-Tris(1-phenyl-1H-benzimidazol-2-yl)benzene (TPBI) is deposited in a high vacuum of $1\times10^{-6}$ Torr or less to form an electron transport layer having a thickness of 50 nm.

Next, on the electron transport layer, Ir(ppy)$_2$(acac) that is an organic small molecule light-emitting material as a dopant, and CBP that is an organic small molecule material as a host are deposited at a ratio of 3:100 by vacuum thermal deposition to form light emitting layer of 5 nm thickness.

In a high vacuum thermal evaporator as shown in FIG. 4, a perovskite hole transport layer (CsPbCl$_3$) is formed by co-depositing CsCl and PbCl$_2$ on the light emitting layer in a high vacuum ($1\times10^{-7}$ Torr) state through thermal deposition.

Aluminum is deposited thereon to form cathode of 100 nm thickness to fabricate a light emitting device.

The fabricated light emitting device exhibits the highest luminance of about 10,000 cd/m² and the highest current efficiency of about 30 cd/A.

Manufacturing Example 3: Manufacture of Light Emitting Device (Normal Structure) Including Perovskite Hole Transport Layer Except that a perovskite Cs$_x$MA$_y$FA$_{(1-x-y)}$PbCl$_m$Br$_n$I$_{(3-m-n)}$ (x, y, m, n is a real number greater than 0, x+y<1, m+n<3, MA: methylammonium, FA: formamidinium) is used as a hole transport layer, light emitting device is manufactured through the same process as in Manufacturing Example 1.

The fabricated light emitting device exhibits the highest luminance of about 7,500 cd/m² and the highest current efficiency of about 40 cd/A.

Manufacturing Example 4: Manufacture of Light Emitting Device (Normal Structure) Including Perovskite Electron Transport Layer Except that TCTA organic material is used as the hole transport layer, and the perovskite Cs$_x$MA$_y$FA$_{(1-x-y)}$PbCl$_m$Br$_n$I$_{(3-m-n)}$ (x, y, m, n is a real number greater than 0, x+y<1, m+n<3, MA: methylammonium, FA: formamidinium) is deposited as a hole transport layer, light emitting device is manufactured through the same process as in Manufacturing Example 1.

The fabricated light emitting device exhibits the highest luminance of about 7,500 cd/m² and the highest current efficiency of about 17 cd/A.

Manufacturing Example 5: Manufacture of Light Emitting Device (Normal Structure) Including Perovskite Hole Transport Layer and Perovskite Electron Transport Layer Except that the hole transport layer and the electron transport layer are deposited by using perovskite Cs$_x$MA$_y$FA$_{(1-x-y)}$PbCl$_m$Br$_n$I$_{(3-m-n)}$ (x, y, m, n is a real number greater than 0, x+y<1, m+n<3, MA: methylammonium, FA: formamidinium) having respectively different compositions, light emitting device is manufactured through the same process as in Manufacturing Example 1.

The fabricated light emitting device exhibits the highest luminance of about 7,500 cd/m² and the highest current efficiency of about 40 cd/A.

Manufacturing Example 6: Manufacture of Light Emitting Device (Normal Structure) Including Perovskite Hole Transport Layer and Perovskite Electron Transport Layer Except that the hole transport layer and the electron transport layer are deposited by using perovskite Cs$_x$MA$_y$FA$_{(1-x-y)}$PbCl$_m$Br$_n$I$_{(3-m-n)}$ (x, y, m, n is a real number greater than 0, x+y<1, m+n<3, MA: methylammonium, FA: formamidinium) having the same compositions from each other, light emitting device is manufactured through the same process as in Manufacturing Example 1.

The fabricated light emitting device exhibits the highest luminance of about 7,500 cd/m² and the highest current efficiency of about 50 cd/A.

Manufacturing Example 7: Manufacture of Light Emitting Device (Inverted Structure) Including Perovskite Electron Transport Layer Except that a perovskite Cs$_x$MA$_y$FA$_{(1-x-y)}$PbCl$_m$Br$_n$I$_{(3-m-n)}$ (x, y, m, n is a real number greater than 0, x+y<1, m+n<3, MA: methylammonium, FA: formamidinium) is deposited as a electron transport layer, light emitting device is manufactured through the same process as in Manufacturing Example 2.

The fabricated light emitting device exhibits the highest luminance of about 7,500 cd/m² and the highest current efficiency of about 17 cd/A.

Manufacturing Example 8: Manufacture of Light Emitting Device (Inverted Structure) Including Perovskite Hole Transport Layer Except that TPBI is deposited as the electron transport layer and the perovskite Cs$_x$MA$_y$FA$_{(1-x-y)}$PbCl$_m$Br$_n$I$_{(3-m-n)}$ (x, y, m, n is a real number greater than 0, x+y<1, m+n<3, MA: methylammonium, FA: formamidinium) is deposited as hole transport layer, light emitting device is manufactured through the same process as in Manufacturing Example 2.

The fabricated light emitting device exhibits the highest luminance of about 7,500 cd/m² and the highest current efficiency of about 17 cd/A.

Manufacturing Example 9: Manufacture of Light Emitting Device (Inverted Structure) Including Perovskite Hole Transport Layer and Perovskite Electron Transport Layer Except that the hole transport layer and the electron transport layer are deposited by using perovskite $Cs_xMA_yFA_{(1-x-y)}PbCl_mBr_nI_{(3-m-n)}$ (x, y, m, n is a real number greater than 0, x+y<1, m+n<3, MA: methylammonium, FA: formamidinium) having respectively different compositions, light emitting device is manufactured through the same process as in Manufacturing Example 2.

The fabricated light emitting device exhibits the highest luminance of about 7,500 cd/m² and the highest current efficiency of about 17 cd/A.

Manufacturing Example 10: Manufacture of Light Emitting Device (Inverted Structure) Including Perovskite Hole Transport Layer and Perovskite Electron Transport Layer Except that the hole transport layer and the electron transport layer are deposited by using perovskite $Cs_xMA_y FA_{(1-x-y)}PbCl_mBr_nI_{(3-m-n)}$ (x, y, m, n is a real number greater than 0, x+y<1, m+n<3, MA: methylammonium, FA: formamidinium) having mutually the same compositions, light emitting device is manufactured through the same process as in Manufacturing Example 1.

The fabricated light emitting device exhibits the highest luminance of about 7,500 cd/m² and the highest current efficiency of about 17 cd/A.

Embodiments and drawings of the present invention are merely presented specific examples to aid understanding, and are not intended to limit the scope of the present invention. In addition to the embodiments disclosed herein, it is apparent to those of ordinary skill in the art that other modified examples based on the technical idea of the present invention may be implemented.

The invention claimed is:

1. A light emitting device comprising:
   an anode and a cathode;
   a light emitting layer disposed between the anode and the cathode;
   a first charge transport layer disposed between the anode and the light emitting layer, and functioning as a hole injection layer or a hole transport layer; and
   a second charge transport layer disposed between the light emitting layer and the cathode, and functioning as an electron injection layer or an electron transport layer,
   wherein the first charge transport layer or the second charge transport layer adjacent to the light emitting layer is a perovskite thin film,
   wherein the perovskite thin film is used as the second charge transport layer, an energy level of conduction band maximum (CBM) of the perovskite thin film is higher than an energy level of lowest unoccupied molecular orbital (LUMO) of the light emitting layer, and
   wherein a perovskite of the perovskite thin film has structure of $ABX_3$, $A_2BX_4$, $ABX_4$ or $A_{n-1}Pb_nI_{3n+1}$ (n is an integer between 2 and 6), wherein A is an organic ammonium ion, an organic amidinium ions, organic phosphonium ions, alkali metal ions, Pb, Mn, Cu, Ga, Ge, In, Al, Sb, Bi, Po, Sn, Ni, Co, Fe, Cr, Pd, Cd, Ca, Sr, a combination or derivatives thereof, B is a transition metal, alkaline earth metal, organic material, inorganic material, ammonium, their derivatives, or a combination thereof, and X is a halogen ion or a combination of different halogen ions.

2. The light emitting device of claim 1, wherein the perovskite thin film of the first charge transport layer and the perovskite thin film of the second charge transport layer are the same or different from each other.

3. The light emitting device of claim 1, wherein A is $CH(NH_2)_2$, $C_xH_{2x+1}(CNH_3)$, $(CH_3NH_3)_n$, $((C_xH_{2x+1})_n NH_3)_n(CH_3NH_3)_n$, $R(NH_2)_2$(R=alkyl), $(C_2H_{2n+1}NH_3)_n$, $CF_3NH_3$, $(CF_3NH_3)_n$, $((C_xF_{2x+1})_nNH_3)_n(CF_3NH_3)_n$, $((C_xF_{2x+1})NH_3)_n$, $(C_nF_{2n+1}NH_3)_n$ (n and x are integers from 1 to 100), Na, K, Rb, Cs, Fr, a combination or derivative thereof,
   and
   the X is Cl, Br, I, or a combination thereof.

4. The light emitting device of claim 1, wherein a crystal size in the perovskite thin film is 1 nm to 5 μm.

5. The light emitting device of claim 1, wherein a thickness of the perovskite thin film is 10 nm to 5 μm.

6. The light emitting device of claim 1, wherein the perovskite thin film is formed by direct crystallization using co-depositing or sequentially depositing AX compound and $BX_2$ compound, which are perovskite precursors, from different crucibles respectively.

7. The light emitting device of claim 1, wherein the perovskite thin film is used as the first charge transport layer, the energy level of valence band maximum (VBM) of the perovskite thin film is lower than the energy level of highest occupied molecular orbital (HOMO) of the light emitting layer.

8. A method of manufacturing light emitting device of claim 1 comprising:
   forming the anode on substrate;
   forming the first charge transport layer as the hole injection layer or the hole transport layer on the anode;
   forming the light emitting layer on the first charge transport layer;
   forming the second charge transport layer as the electron injection layer or the electron transport layer on the light emitting layer; and
   forming the cathode on the second charge transport layer,
   wherein the forming the first charge transport layer or the forming the second charge transport layer is a step of forming the perovskite thin film by using a deposition method,
   wherein the perovskite thin film is used as the second charge transport layer, an energy level of conduction band maximum (CBM) of the perovskite thin film is higher than an energy level of lowest unoccupied molecular orbital (LUMO) of the light emitting layer, and
   wherein a perovskite of the perovskite thin film has structure of $ABX_3$, $A_2BX_4$, $ABX_4$ or $A_{n-1}Pb_nI_{3n+1}$ (n is an integer between 2 and 6), wherein A is an organic ammonium ion, an organic amidinium ions, organic phosphonium ions, alkali metal ions, Pb, Mn, Cu, Ga, Ge, In, Al, Sb, Bi, Po, Sn, Ni, Co, Fe, Cr, Pd, Cd, Ca, Sr, a combination or derivatives thereof, B is a transition metal, alkaline earth metal, organic material, inorganic material, ammonium, their derivatives, or a combination thereof, and X is a halogen ion or a combination of different halogen ions.

9. The method of manufacturing light emitting device of claim 8, wherein the deposition method is selected from group consisting of vacuum deposition, thermal deposition, flash deposition, laser deposition, chemical vapor deposition, atomic layer deposition, physical vapor deposition, physical-chemical co-evaporation deposition, sequential vapor deposition and solution process-assisted thermal deposition.

10. A method of manufacturing light emitting device of claim 1 comprising:
- forming the cathode on substrate;
- forming the second charge transport layer as the electron injection layer or the electron transport layer on the cathode;
- forming the light emitting layer on the second charge transport layer;
- forming the first charge transport layer as the hole injection layer or the hole transport layer on the light emitting layer; and
- forming the anode on the first charge transport layer,
- wherein the forming the first charge transport layer or the forming the second charge transport layer is a step of forming the perovskite thin film by using a deposition method,
- wherein the perovskite thin film is used as the second charge transport layer, an energy level of conduction band maximum (CBM) of the perovskite thin film is higher than an energy level of lowest unoccupied molecular orbital (LUMO) of the light emitting layer,
- wherein a perovskite of the perovskite thin film has structure of $ABX_3$, $A_2BX_4$, $ABX_4$ or $A_{n-1}Pb_nI_{3n+1}$ (n is an integer between 2 and 6), wherein A is an organic ammonium ion, an organic amidinium ions, organic phosphonium ions, alkali metal ions, Pb, Mn, Cu, Ga, Ge, In, Al, Sb, Bi, Po, Sn, Ni, Co, Fe, Cr, Pd, Cd, Ca, Sr, a combination or derivatives thereof, B is a transition metal, alkaline earth metal, organic material, inorganic material, ammonium, their derivatives, or a combination thereof, and X is a halogen ion or a combination of different halogen ions.

* * * * *